(12) United States Patent
Bartling et al.

(10) Patent No.: US 8,897,088 B2
(45) Date of Patent: Nov. 25, 2014

(54) NONVOLATILE LOGIC ARRAY WITH BUILT-IN TEST RESULT SIGNAL

(71) Applicant: Texas Instruments Incorporated, Dallas, TX (US)

(72) Inventors: Steven Craig Bartling, Plano, TX (US); Sudhanshu Khanna, Richardson, TX (US)

(73) Assignee: Texas Instrument Incorporated, Dallas, TX (US)

( * ) Notice: Subject to any disclaimer, the term of this patent is extended or adjusted under 35 U.S.C. 154(b) by 180 days.

(21) Appl. No.: 13/753,771

(22) Filed: Jan. 30, 2013

(65) Prior Publication Data

US 2014/0211572 A1 Jul. 31, 2014

(51) Int. Cl.
*G11C 29/50* (2006.01)
*G11C 29/08* (2006.01)
G11C 29/34 (2006.01)
G11C 11/401 (2006.01)
G11C 29/02 (2006.01)

(52) U.S. Cl.
CPC ............... *G11C 29/08* (2013.01); *G11C 29/50* (2013.01); *G11C 29/34* (2013.01); *G11C 11/401* (2013.01); *G11C 29/02* (2013.01)
USPC . 365/201; 365/185.29; 365/218; 365/185.12; 365/154

(58) Field of Classification Search
CPC ...... G11C 29/50; G11C 11/401; G11C 29/02; G11C 29/34
USPC ................. 365/201, 185.29, 218, 185.12, 154
See application file for complete search history.

(56) References Cited

U.S. PATENT DOCUMENTS

| 7,606,091 | B2 | 10/2009 | Li et al. |
| 7,639,056 | B2 | 12/2009 | Gururajarao et al. |
| 7,650,554 | B2 * | 1/2010 | Goldrian et al. ............... 714/733 |
| 2005/0172188 | A1 | 8/2005 | Burdine |
| 2005/0246597 | A1 | 11/2005 | Whetsel |

(Continued)

FOREIGN PATENT DOCUMENTS

EP 0947994 A2 6/1999

OTHER PUBLICATIONS

Yiqun Wang et al, "A Compression-based Area-efficient Recovery Architecture for Nonvolatile Processors", Design, Automation & Test in Europe Conference & Exhibition (Date), Dresden, Germany, Mar. 12-16, 2012, pp. 1519-1524.

(Continued)

*Primary Examiner* — Jason Lappas
(74) *Attorney, Agent, or Firm* — John R. Pessetto; Frederick J. Telecky, Jr.

(57) ABSTRACT

A system on chip (SoC) provides a nonvolatile memory array that is configured as n rows by m columns of bit cells. Each of the bit cells is configured to store a bit of data. There are m bit lines each coupled to a corresponding one of the m columns of bit cells. There are m write drivers each coupled to a corresponding one of the m bit lines. An AND gate is coupled to the m bit lines and has an output line coupled to an input of a test controller on the SoC. An OR gate is coupled to the m bit lines and has an output line coupled to an input of the test controller.

14 Claims, 14 Drawing Sheets

(56) References Cited

U.S. PATENT DOCUMENTS

2008/0258562 A1 10/2008 Fagg
2009/0207642 A1 8/2009 Shimano et al.
2009/0316469 A1 12/2009 Rodriguez

OTHER PUBLICATIONS

Shoichi Masui el at, "Design and Applications of Ferroelectric Nonvolatile SRAM and Flip-Flop with Unlimited Read/Program Cycles and Stable Recall", Proceedings of the IEEE 2003 Custom Integrated Circuits Conference, San Jose, California, Sep. 21-24, 2003, pp. 403-406.

T.S. Moise et al, "Electrical Propertes of Submicron (0.13/spl mu/m/sup2/) Ir/PZT/Ir Capacitors Formed on W Plugs", 1999 International Electron Devices Meeting Technical Digest, Washington, DC, Dec. 5-8, 1999, pp. 940-942.

Yiqun Wang et al, "A 3us Wake-up Time Nonvolatile Processor Based on Ferroelectric Flip-Flops", 2012 Proceedings of the ESSCIRC (ESSCIRC), Bordeaux, France, Sep. 17-21, 2012, pp. 149-152.

K.R. Udayakumar et al, "Manufacture High-Density 8Mbit One Transistor-One Capacitator Embedded Ferroelectric Random Access Memory", Japanese Journal of Applied Physics, vol. 47, No. 4, 2008, pp. 2710-2713.

T.S. Moise et al, "Demonstraton of a 4Mb, High Density Ferroelectric Memory Embedded within a 130nm, 5LM Cu/FSG Logic Process", International Electron Devices Meeting, 2002, San Francisco, CA, Dec. 8-11, 2002, pp. 535-538.

Wing-Kei Yu et al, "A Non-Volatile Microcontroller with Integrated Floating-Gate Transistors", 2011 IEEE/IFIP 41st International Conference on Dependable Systems and Networks Workshops (DSN-W), Hong Kong, China, Jun. 27-30, 2011, pp. 75-80.

* cited by examiner

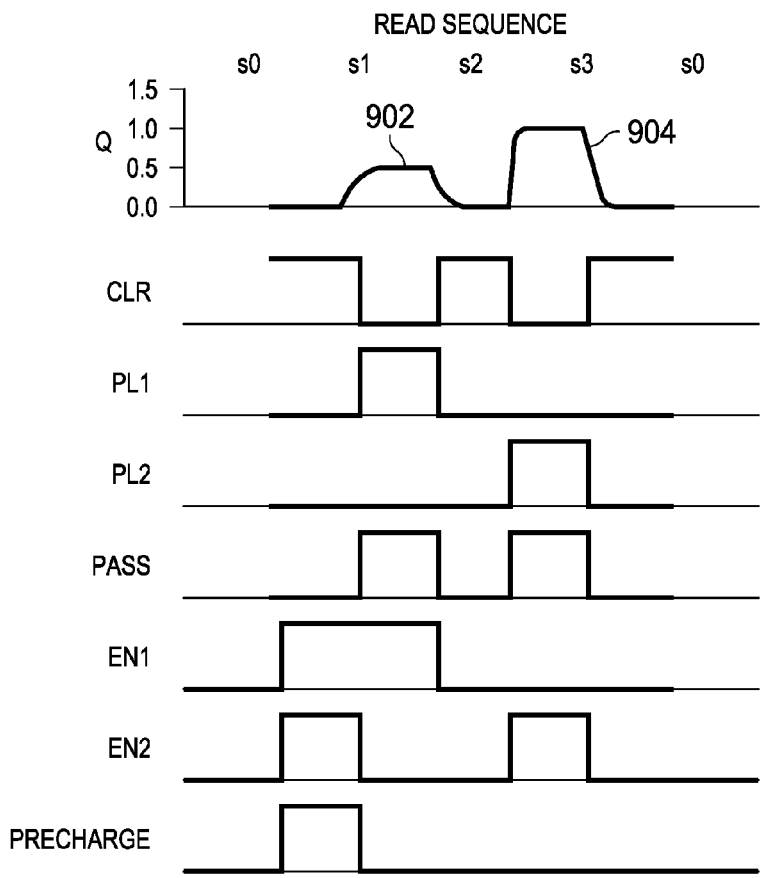
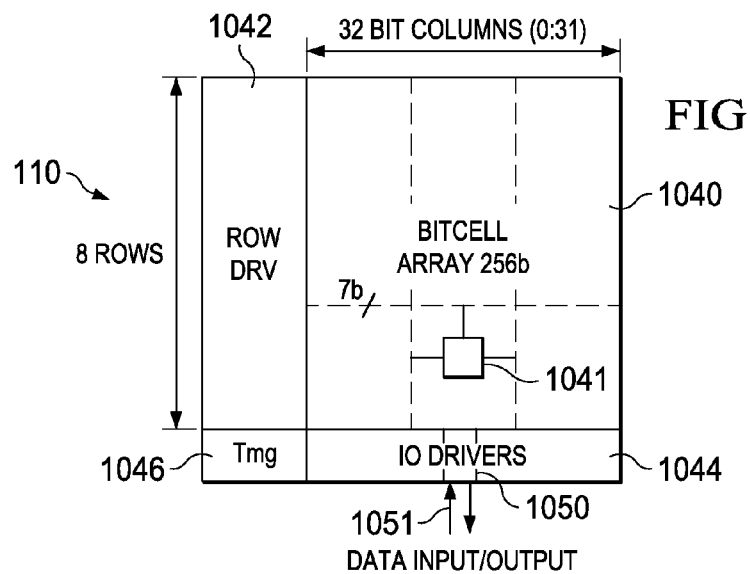

NONVOLATILE LOGIC ARRAY WITH BUILT-IN TEST RESULT SIGNAL

FIELD OF THE INVENTION

This invention generally relates to nonvolatile memory cells and their use in a system, and in particular, in combination with logic arrays to provide nonvolatile logic modules.

BACKGROUND OF THE INVENTION

Many portable electronic devices such as cellular phones, digital cameras/camcorders, personal digital assistants, laptop computers, and video games operate on batteries. During periods of inactivity the device may not perform processing operations and may be placed in a power-down or standby power mode to conserve power. Power provided to a portion of the logic within the electronic device may be turned off in a low power standby power mode. However, presence of leakage current during the standby power mode represents a challenge for designing portable, battery operated devices. Data retention circuits such as flip-flops and/or latches within the device may be used to store state information for later use prior to the device entering the standby power mode. The data retention latch, which may also be referred to as a shadow latch or a balloon latch, is typically powered by a separate 'always on' power supply.

A known technique for reducing leakage current during periods of inactivity utilizes multi-threshold CMOS (MTCMOS) technology to implement a shadow latch. In this approach, the shadow latch utilizes thick gate oxide transistors and/or high threshold voltage ($V_t$) transistors to reduce the leakage current in standby power mode. The shadow latch is typically detached from the rest of the circuit during normal operation (e.g., during an active power mode) to maintain system performance. To retain data in a 'master-slave' flip-flop topology, a third latch, e.g., the shadow latch, may be added to the master latch and the slave latch for the data retention. In other cases, the slave latch may be configured to operate as the retention latch during low power operation. However, some power is still required to retain the saved state. For example, see U.S. Pat. No. 7,639,056, "Ultra Low Area Overhead Retention Flip-Flop for Power-Down Applications".

System on Chip (SoC) is now a commonly used concept; the basic approach is to integrate more and more functionality into a given device. This integration can take the form of either hardware or solution software. Performance gains are traditionally achieved by increased clock rates and more advanced process nodes. Many SoC designs pair a microprocessor core, or multiple cores, with various peripheral devices and memory circuits.

Energy harvesting, also known as power harvesting or energy scavenging, is the process by which energy is derived from external sources, captured, and stored for small, wireless autonomous devices, such as those used in wearable electronics and wireless sensor networks. Harvested energy may be derived from various sources, such as: solar power, thermal energy, wind energy, salinity gradients and kinetic energy, etc. However, typical energy harvesters provide a very small amount of power for low-energy electronics. The energy source for energy harvesters is present as ambient background and is available for use. For example, temperature gradients exist from the operation of a combustion engine and in urban areas; there is a large amount of electromagnetic energy in the environment because of radio and television broadcasting, etc.

BRIEF DESCRIPTION OF THE DRAWINGS

Particular embodiments in accordance with the invention will now be described, by way of example only, and with reference to the accompanying drawings:

FIGS. 8-9 are schematic and timing diagrams illustrating another embodiment of a ferroelectric nonvolatile bit cell;

FIG. 10 is a block diagram illustrating an NVL array used in the SoC of FIG. 1;

Figure 1:
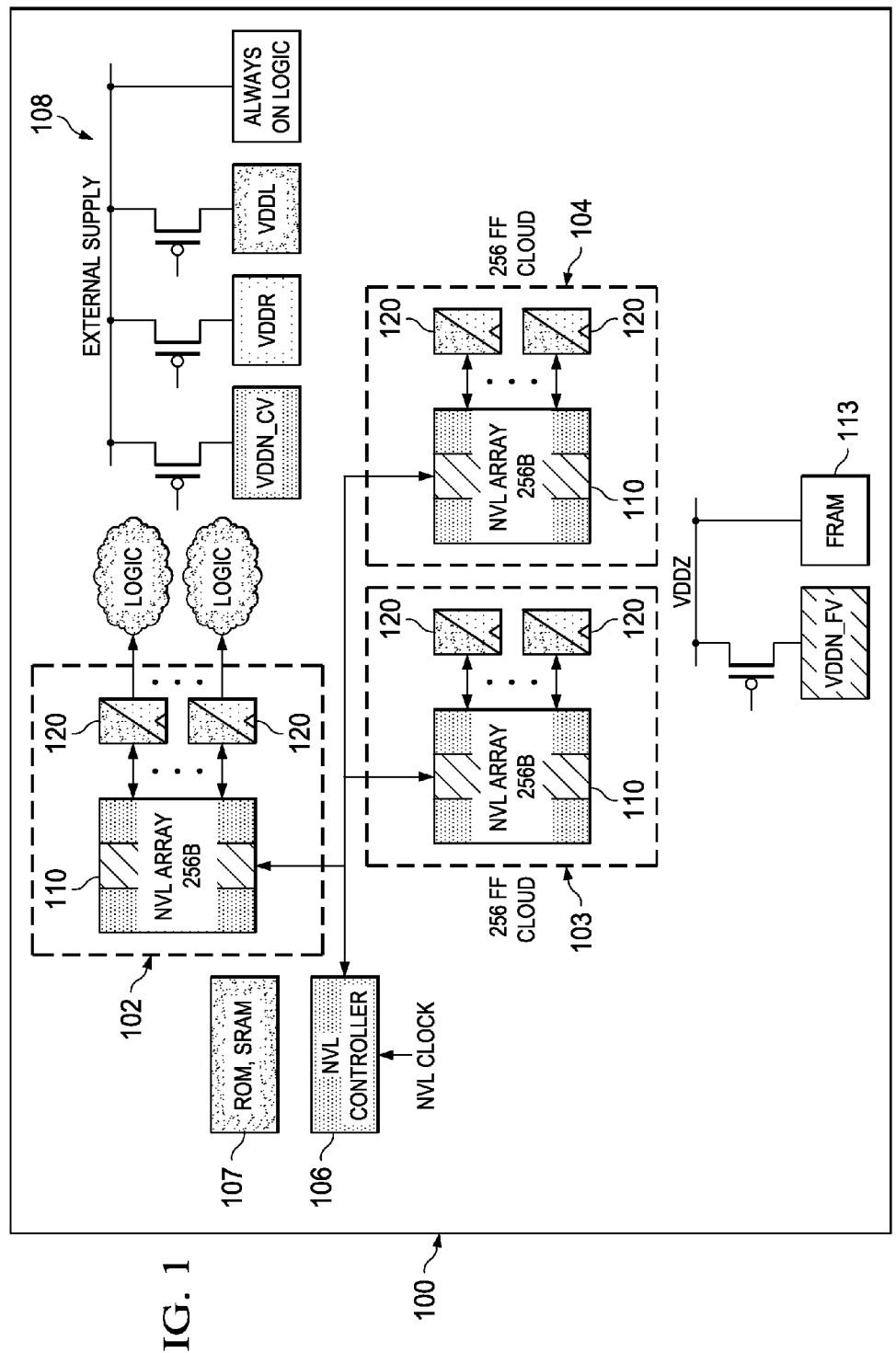
FIG. 1 is a functional block diagram of a portion of a system on chip (SoC) that includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A memory array is described herein that includes an AND gate that has an input coupled to each column of the memory array and an OR gate that has an input coupled to each column of the memory array. The AND and OR gate allow the memory array to be easily tested by providing a single signal from the AND gate that indicates if a selected row contains all ones, and by providing a single signal from the OR that indicates if the selected row contains all zeros.

While prior art systems made use of retention latches to retain the state of flip-flops in logic modules during low power operation, some power is still required to retain state. Embodiments of the present invention may use nonvolatile elements to retain the state of flip flops in a logic module while power is completely removed. Such logic elements will be referred to herein as Non-Volatile Logic (NVL). A microcontrol unit (MCU) implemented with NVL within an SoC (system on a chip) may have the ability to stop, power down, and power up with no loss in functionality. A system reset/reboot is not required to resume operation after power has been completely removed. This capability is ideal for emerging energy harvesting applications, such as Near Field Communication (NFC), radio frequency identification (RFID) applications, and embedded control and monitoring systems, for example, where the time and power cost of the reset/reboot process can consume much of the available energy, leaving little or no energy for useful computation, sensing, or control functions. Though the present embodiment utilizes an SoC (system on chip) containing a programmable MCU for sequencing the SoC state machines, one of ordinary skill in the art can see that NVL can be applied to state machines hard coded into ordinary logic gates or ROM (read only memory), PLA (programmable logic array), or PLD (programmable logic device) based control systems, for example.

An embodiment of the invention may be included within an SoC to form one or more blocks of nonvolatile logic. For example, a non-volatile logic (NVL) based SoC may back up its working state (all flip-flops) upon receiving a power interrupt, have zero leakage in sleep mode, and need less than 400 ns to restore the system state upon power-up.

Without NVL, a chip would either have to keep all flip-flops powered in at least a low power retention state that requires a continual power source even in standby mode, or waste energy and time rebooting after power-up. For energy harvesting applications, NVL is useful because there is no constant power source required to preserve the state of flip-flops (FFs), and even when the intermittent power source is available, boot-up code alone may consume all the harvested energy. For handheld devices with limited cooling and battery capacity, zero-leakage IC's (integrated circuits) with "instant-on" capability are ideal.

Ferroelectric random access memory (FRAM) is a nonvolatile memory technology with similar behavior to DRAM (dynamic random access memory). Each individual bit can be accessed, but unlike EEPROM (electrically erasable programmable read only memory) or Flash, FRAM does not require a special sequence to write data nor does it require a charge pump to achieve required higher programming voltages. Each ferroelectric memory cell contains one or more ferroelectric capacitors (FeCap). Individual ferroelectric capacitors may be used as non-volatile elements in the NVL circuits described herein.

FIG. 1 is a functional block diagram of a portion of a system on chip (SoC) 100 that includes an embodiment of the invention. While the term SoC is used herein to refer to an integrated circuit that contains one or more system elements, other embodiments may be included within various types of integrated circuits that contain functional logic modules such as latches and flip-flops that provide non-volatile state retention. Embedding non-volatile elements outside the controlled environment of a large array presents reliability and fabrication challenges, as described in more detail in references [2-5]. An NVL bitcell is typically designed for maximum read signal margin and in-situ margin testability as is needed for any NV-memory technology. However, adding testability features to individual NVL FFs may be prohibitive in terms of area overhead. To amortize the test feature costs and improve manufacturability, SoC 100 is implemented using 256 bit mini-arrays 110, which will be referred to herein as NVL arrays, of FeCap (ferroelectric capacitor) based bitcells dispersed throughout the logic cloud to save state of the various flip flops 120 when power is removed. Each cloud 102-104 of FFs 120 includes an associated NVL array 110. A central NVL controller 106 controls all the arrays and their communication with FFs 120. While three FF clouds 102-104 are illustrated here, SoC 100 may have additional, or fewer, FF clouds all controlled by NVL controller 106. The existing NVL array embodiment uses 256 bit mini-arrays, but one skilled in the art can easily see that arrays may have a greater or lesser number of bits as needed.

SoC 100 is implemented using modified retention flip flops 120. There are various known ways to implement a retention flip flop. For example, a data input may be latched by a first latch. A second latch coupled to the first latch may receive the data input for retention while the first latch is inoperative in a standby power mode. The first latch receives power from a first power line that is switched off during the standby power mode. The second latch receives power from a second power line that remains on during the standby mode. A controller receives a clock input and a retention signal and provides a clock output to the first latch and the second latch. A change in the retention signal is indicative of a transition to the standby power mode. The controller continues to hold the clock output at a predefined voltage level and the second latch continues to receive power from the second power line in the standby power mode, thereby retaining the data input. Such a retention latch is described in more detail in U.S. Pat. No. 7,639,056, "Ultra Low Area Overhead Retention Flip-Flop for Power-Down Applications", which is incorporated by reference herein. Another embodiment of a retention latch will be described in more detail with regard to FIG. 2. In that embodiment, the retention flop architecture does not require that the clock be held in a particular state during retention. In such a "clock free" NVL flop design, the clock value is a "don't care" during retention.

In SoC 100, modified retention FFs 120 include simple input and control modifications to allow the state of each FF to be saved in an associated FeCap bit cell in NVL array 110 when the system is being transitioned to a power off state. When the system is restored, then the saved state is transferred from NVL array 110 back to each FF 120. In SoC 100, NVL arrays 110 and controller 106 are operated on an NVL power domain referred to as VDDN and are switched off during regular operation. All logic, memory blocks 107 such as ROM (read only memory) and SRAM (static random access memory), and master stage of FFs are on a logic power domain referred to as VDDL. FRAM (ferroelectric random access memory) arrays are directly connected to a dedicated global supply rail (VDDZ) that may be maintained at a higher fixed voltage needed for FRAM. In a typical embodiment, VDDZ is a fixed supply and VDDL can be varied as long as VDDL remains at a lower potential than VDDZ. Note that FRAM arrays 103 may contain integrated power switches that allow the FRAM arrays to be powered down as needed. However, it can easily be seen that FRAM arrays without internal power switches can be utilized in conjunction with power switches that are external to the FRAM array. The slave stages of retention FFs are on a retention power domain referred to as the VDDR domain to enable regular retention in a stand-by mode of operation.

Table 1 summarizes power domain operation during normal operation, system backup to NVL arrays, sleep mode, system restoration from NVL arrays, and back to normal operation. Table 1 also specifies domains used during a standby idle mode that may be initiated under control of system software in order to enter a reduced power state using the volatile retention function of the retention flip flops. A set of switches such as indicated at 108 are used to control the various power domains. There may be multiple switches 108 that may be distributed throughout SoC 100 and controlled by software executed by a processor on SoC 100 and/or by a hardware controller (not shown) within SoC 100. There may be additional domains in addition to those illustrated here, as will be described later.

TABLE 1 system power modes

| SoC Mode | Trigger | Trigger source | VDDL | VDDR | VDDN_FV VDDN_CV |
|---|---|---|---|---|---|
| Regular operation | na | na | ON | ON | OFF |
| System backup to NVL | Power bad | external | ON | ON | ON |
| Sleep mode | Backup done | NVL controller | OFF | OFF | OFF |
| System restoration from NVL | Power good | external | OFF | ON | ON |
| Regular operation | Restore done | NVL controller | ON | ON | OFF |
| Standby retention mode | idle | System software | OFF | ON | OFF |

State info could be saved in a large centralized FRAM array, but would require more time to enter sleep mode, longer wakeup time, excessive routing, and power costs caused by the lack of parallel access to system FFs.

Figure 2:
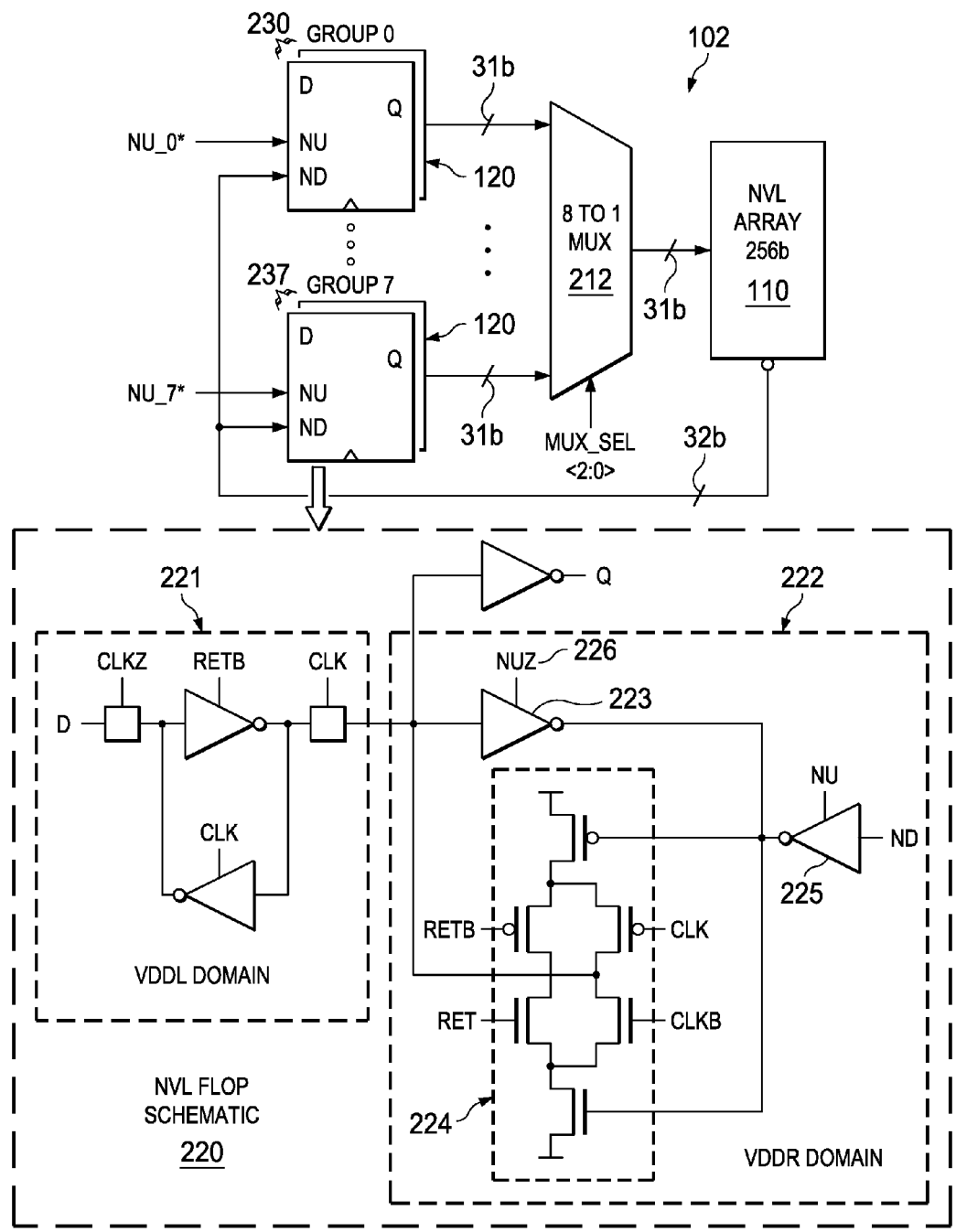
FIG. 2 is a more detailed block diagram of one flip-flop cloud used in the SoC of FIG. 1.

FIG. 2 is a more detailed block diagram of one FF cloud 102 used in SoC 100. In this embodiment, each FF cloud includes up to 248 flip flops and each NVL array is organized as an 8×32 bit array, but one bit is used for parity in this embodiment. However, in other embodiments, the number of flip flops and the organization of the NVL array may have a different configuration, such as 4×m, 16×m, etc, where m is chosen to match the size of the FF cloud. In some embodiments, all of the NVL arrays in the various clouds may be the same size, while in other embodiments there may be different size NVL arrays in the same SoC.

Block 220 is a more detailed schematic of each retention FF 120. Several of the signals have an inverted version indicated by suffix "B" (referring to "bar" or /), such as RET and RETB, CLK and CLKB, etc. Each retention FF includes a master latch 221 and a slave latch 222. Slave latch 222 is formed by inverter 223 and inverter 224. Inverter 224 includes a set of transistors controlled by the retention signal (RET, RETB) that are used to retain the FF state during low power sleep periods, during which power domain VDDR remains on while power domain VDDL is turned off, as described above and in Table 1.

NVL array 110 is logically connected with the 248 FFs it serves in cloud 102. To enable data transfer from an NVL array to the FFs, two additional ports are provided on the slave latch 222 of each FF as shown in block 220. An input for NVL data ND is provided by gate 225 that is enabled by an NVL update signal NU. Inverter 223 is modified to allow the inverted NVL update signal NUB to disable the signal from master latch 221. The additional transistors are not on the critical path of the FF and have only 1.8% and 6.9% impact in normal FF performance and power (simulation data) in this particular implementation. When data from the NVL array is valid on the ND (NVL-Data) port, the NU (NVL-Update) control input is pulsed high for a cycle to write to the FF. The thirty-one data output signals of NVL array 110 fans out to ND ports of the eight thirty-one bit FF groups 230-237.

To save flip-flop state, Q outputs of 248 FFs are connected to the 31 b parallel data input of NVL array 110 through a 31 b wide 8-1 mux 212. To minimize FF loading, the mux may be broken down into smaller muxes based on the layout of the FF cloud and placed close to the FFs they serve. NVL controller 106 synchronizes writing to the NVL array using select signals MUX_SEL <2:0> of 8-1 mux 212. System clock CLK is held in the inactive state during a system backup (for example, CLK is typically held low for positive edge FF based logic and held high for negative edge FF based logic).

To restore flip-flop state, NVL controller 106 reads an NVL row in NVL array 110 and then pulses the NU signal for the appropriate flip-flop group. During system restore, retention signal RET is held high and the slave latch is written from ND with power domain VDDL unpowered; at this point the state of the system clock CLK is a don't care. FF's are placed in the retention state with VDDL=0V and VDDR=VDD in order to suppress excess power consumption related to spurious data switching that occurs as each group of 31 FF's is updated during NVL array read operations. One skilled in the art can easily see that suitably modified non-retention flops can be used in NVL based SOC's at the expense of higher power consumption during NVL data recovery operations.

System clock CLK should start from an inactive state once VDDL comes up and thereafter normal synchronous operation continues with updated information in the FFs. Data transfer between the NVL arrays and their respective FFs can be done in serial or parallel or any combination thereof to tradeoff peak current and backup/restore time. Since a direct access is provided to FFs, intervention from a microcontroller processing unit (CPU) is not required for NVL operations; therefore the implementation is SoC/CPU architecture agnostic. Table 2 summarizes operation of the NVL flip flops.

TABLE 2

NVL Flip Flop truth table

| mode | Clock (CLK) | Retention (RET) | NVL update (NU) | Value saved |
|---|---|---|---|---|
| Regular operation | pulsed | 0 | 0 | From D input |
| retention | X | 1 | 0 | Q value |
| NVL system backup | 0 | 0 | 0 | From Q output |
| NVL system restore | X | 1 | pulsed | NVL cell bit data (ND) |

Figure 3:
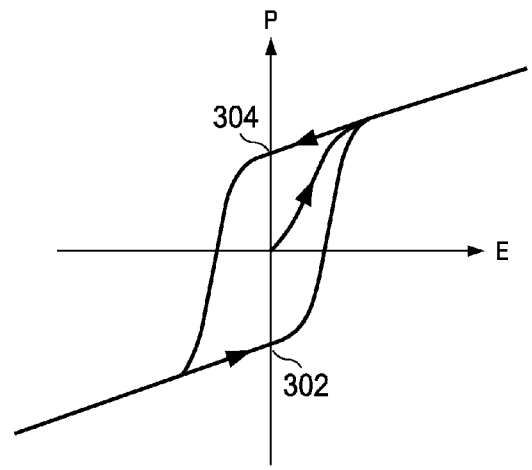
FIG. 3 is a plot illustrating polarization hysteresis exhibited by a ferroelectric capacitor.

FIG. 3 is a plot illustrating polarization hysteresis exhibited by a ferroelectric capacitor. The general operation of ferroelectric bit cells is known. When most materials are polarized, the polarization induced, P, is almost exactly proportional to the applied external electric field E; so the polarization is a linear function, referred to as dielectric polarization. In addition to being nonlinear, ferroelectric materials demonstrate a spontaneous nonzero polarization as illustrated in FIG. 3 when the applied field E is zero. The distinguishing feature of ferroelectrics is that the spontaneous polarization can be reversed by an applied electric field; the polarization is dependent not only on the current electric field but also on its history, yielding a hysteresis loop. The term "ferroelectric" is used to indicate the analogy to ferromagnetic materials, which have spontaneous magnetization and also exhibit hysteresis loops.

The dielectric constant of a ferroelectric capacitor is typically much higher than that of a linear dielectric because of the effects of semi-permanent electric dipoles formed in the crystal structure of the ferroelectric material. When an external electric field is applied across a ferroelectric dielectric, the dipoles tend to align themselves with the field direction, produced by small shifts in the positions of atoms that result in shifts in the distributions of electronic charge in the crystal structure. After the charge is removed, the dipoles retain their polarization state. Binary "0"s and "1"s are stored as one of two possible electric polarizations in each data storage cell. For example, in the figure a "1" may be encoded using the negative remnant polarization 302, and a "0" may be encoded using the positive remnant polarization 304, or vice versa.

Ferroelectric random access memories have been implemented in several configurations. A one transistor, one capacitor (1T-1C) storage cell design in an FeRAM array is similar in construction to the storage cell in widely used DRAM in that both cell types include one capacitor and one access transistor. In a DRAM cell capacitor, a linear dielectric is used, whereas in an FeRAM cell capacitor the dielectric structure includes ferroelectric material, typically lead zirconate titanate (PZT). Due to the overhead of accessing a DRAM type array, a 1T-1C cell is less desirable for use in small arrays such as NVL array 110.

A four capacitor, six transistor (4C-6T) cell is a common type of cell that is easier to use in small arrays. One such cell is described in more detail in reference [2], which is incorporated by reference herein. An improved four capacitor cell will now be described.

Figure 4:
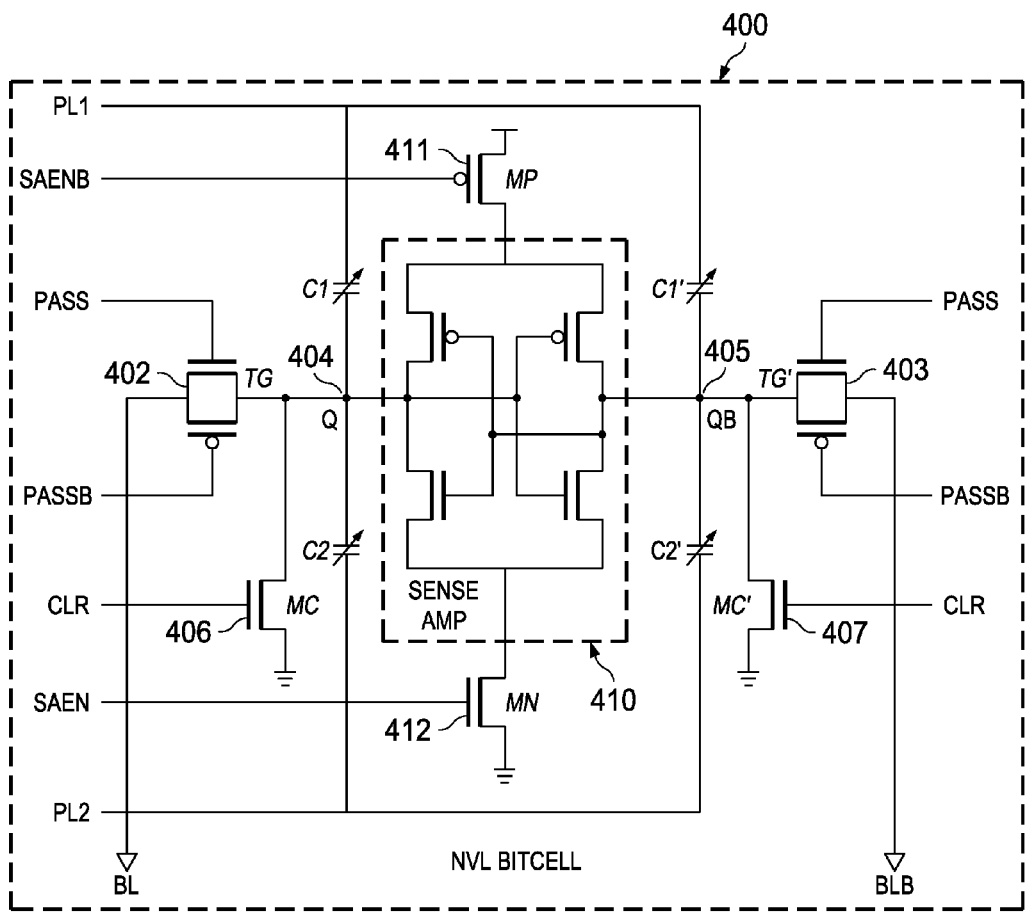
FIGS. 4-7 are schematic and timing diagrams illustrating one embodiment of a ferroelectric nonvolatile bit cell.

FIG. 4 is a schematic illustrating one embodiment of a ferroelectric nonvolatile bitcell 400 that includes four capacitors and twelve transistors (4C-12T). The four FeCaps are arranged as two pairs in a differential arrangement. FeCaps C1 and C2 are connected in series to form node Q 404, while FeCaps C1' and C2' are connected in series to form node QB 405, where a data bit is written into node Q and stored in FeCaps C1 and C2 via bit line BL and an inverse of the data bit is written into node QB and stored in FeCaps C1' and C2' via inverse bitline BLB. Sense amp 410 is coupled to node Q and to node QB and is configured to sense a difference in voltage appearing on nodes Q, QB when the bitcell is read. The four transistors in sense amp 410 are configured as two cross coupled inverters to form a latch. Pass gate 402 is configured to couple node Q to bitline B and pass gate 403 is configured to couple node QB to bit line BLB. Each pass gate 402, 403 is implemented using a PMOS device and an NMOS device connected in parallel. This arrangement reduces voltage drop across the pass gate during a write operation so that nodes Q, QB are presented with a higher voltage during writes and thereby a higher polarization is imparted to the FeCaps.

Plate line 1 (PL1) is coupled to FeCaps C1 and C1' and plate line 2 (PL2) is coupled to FeCaps C2 and C2'. The plate lines are use to provide biasing to the FeCaps during reading and writing operations.

Alternatively, in another embodiment the CMOS pass gates can be replaced with NMOS pass gates that use a pass gate enable that is has a voltage higher than VDDL. The magnitude of the higher voltage must be larger than the usual NMOS Vt in order to pass an un-degraded signal from the bitcell Q/QB nodes to/from the bitlines BL/BLB. Therefore, in such an embodiment, Vpass_gate_control should be >VDDL+Vt.

Typically, there will be an array of bit cells 400. There may then be multiple columns of similar bitcells to form an n row by m column array. For example, in SoC 100, the NVL arrays are 8×32; however, as discussed earlier, different configurations may be implemented.

Figure 5:
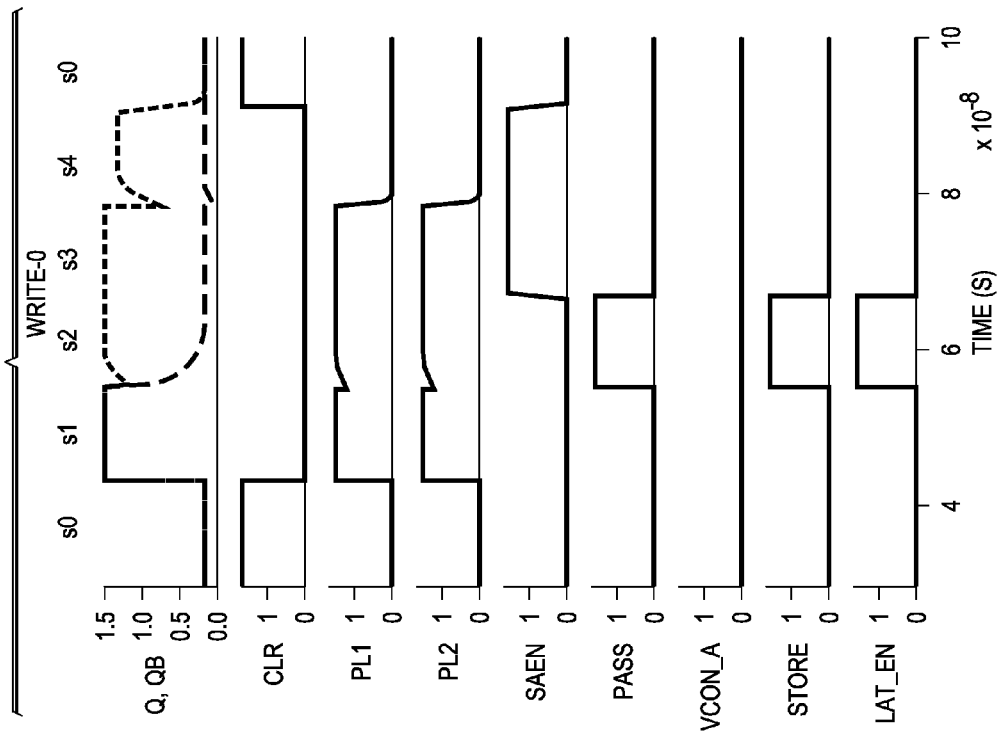
Figure 6:
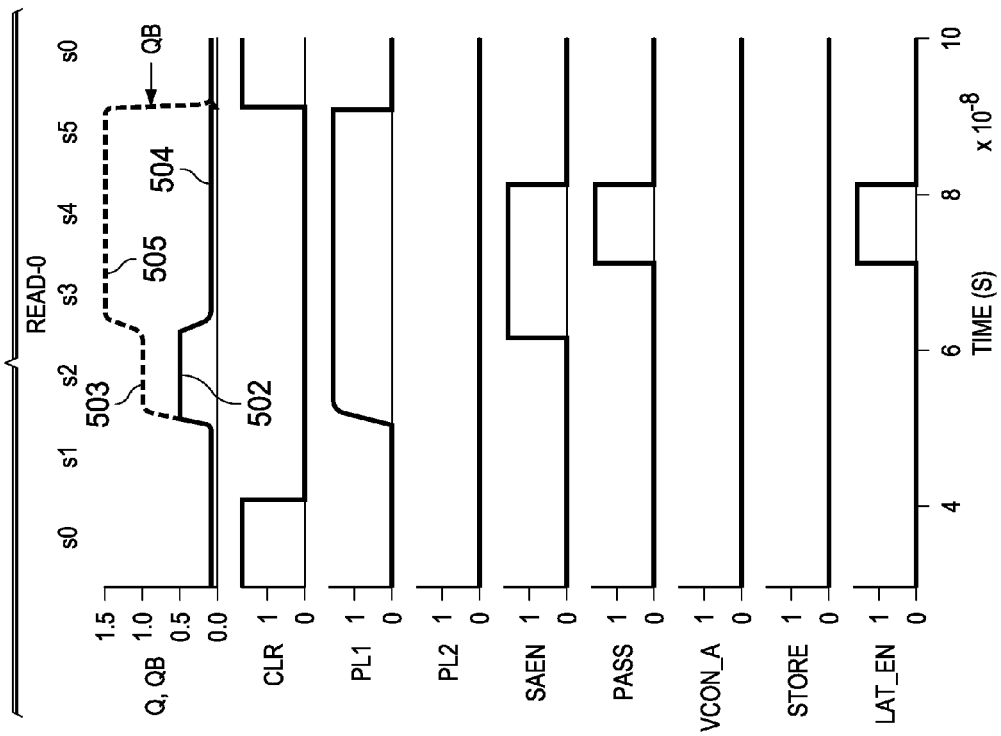

FIGS. 5 and 6 are timing diagram illustrating read and write waveforms for reading a data value of logical 0 and writing a data value of logical 0, respectively. Reading and writing to the NVL array is a multi-cycle procedure that may be controlled by the NVL controller 106 and synchronized by the NVL clock. In another embodiment, the waveforms may be sequenced by fixed or programmable delays starting from a trigger signal, for example. During regular operation, a typical 4C-6T bitcell is susceptible to time dependent dielectric breakdown (TDDB) due to a constant DC bias across FeCaps on the side storing a "1". In a differential bitcell, since an inverted version of the data value is also stored, one side or the other will always be storing a "1".

To avoid TDDB, plate line PL1, plate line PL2, node Q and node QB are held at a quiescent low value when the cell is not being accessed, as indicated during time periods s0 in FIGS. 5, 6. Power disconnect transistors MP 411 and MN 412 allow sense amp 410 to be disconnected from power during time periods s0 in response to sense amp enable signals SAEN and SAENB. Clamp transistor MC 406 is coupled to node Q and clamp transistor MC' 407 is coupled to node QB. Clamp transistors 406, 407 are configured to clamp the Q and QB nodes to a voltage that is approximately equal to the low logic voltage on the plate lines in response to clear signal CLR during non-access time periods s0, which in this embodiment equal 0 volts, (the ground potential). In this manner, during times when the bit cell is not being accessed for reading or writing, no voltage is applied across the FeCaps and therefore TDDB is essentially eliminated. The clamp transistors also serve to prevent any stray charge buildup on nodes Q and QB due to parasitic leakage currents. Build up of stray charge might cause the voltage on Q or QB to rise above 0 v, leading to a voltage differential across the FeCaps between Q or QB and PL1 and PL2. This can lead to unintended depolarization of the FeCap remnant polarization and could potentially corrupt the logic values stored in the FeCaps.

In this embodiment, Vdd is 1.5 volts and the ground reference plane has a value of 0 volts. A logic high has a value of approximately 1.5 volts, while a logic low has a value of approximately 0 volts. Other embodiments that use logic levels that are different from ground for logic 0 (low) and Vdd for logic 1 (high) would clamp nodes Q, QB to a voltage corresponding to the quiescent plate line voltage so that there is effectively no voltage across the FeCaps when the bitcell is not being accessed.

In another embodiment, two clamp transistors may be used. Each of these two transistors is used to clamp the voltage across each FeCap to be no greater than one transistor Vt (threshold voltage). Each transistor is used to short out the FeCaps. In this case, for the first transistor, one terminal connects to Q and the other one connects to PL1, while for the second transistor, one terminal connects to Q and the other connects to PL2. The transistors can be either NMOS or PMOS, but NMOS is more likely to be used.

Typically, a bit cell in which the two transistor clamp circuit solution is used does not consume significantly more area than the one transistor solution. The single transistor clamp circuit assumes that PL1 and PL2 will remain at the same ground potential as the local VSS connection to the single clamp transistor, which is normally a good assumption. However, noise or other problems may occur (especially during power up) that might cause PL1 or PL2 to glitch or have a DC offset between the PL1/PL2 driver output and VSS for brief periods; therefore, the two transistor design may provide a more robust solution.

To read bitcell 400, plate line PL1 is switched from low to high while keeping plate line PL2 low, as indicated in time period s2. This induces voltages on nodes Q, QB whose values depend on the capacitor ratio between C1-C2 and C1'-C2' respectively. The induced voltage in turn depends on the remnant polarization of each FeCap that was formed during the last data write operation to the FeCap's in the bit cell. The remnant polarization in effect "changes" the effective capacitance value of each FeCap which is how FeCaps provide nonvolatile storage. For example, when a logic 0 was written to bitcell 400, the remnant polarization of C2 causes it to have a lower effective capacitance value, while the remnant polarization of C1 causes it to have a higher effective capacitance value. Thus, when a voltage is applied across C1-C2 by switching plate line PL1 high while holding plate line PL2 low, the resultant voltage on node Q conforms to equation (1). A similar equation holds for node QB, but the order of the remnant polarization of C1' and C2' is reversed, so that the resultant voltages on nodes Q and QB provide a differential representation of the data value stored in bit cell 400, as illustrated at 502, 503 in FIG. 5.

$$V(Q) = V(PL1)\left(\frac{C2}{C1+C2}\right) \quad (1)$$

The local sense amp 410 is then enabled during time period s3. After sensing the differential values 502, 503, sense amp 410 produces a full rail signal 504, 505. The resulting full rail signal is transferred to the bit lines BL, BLB during time period s4 by asserting the transfer gate enable signals PASS, PASSB to enable transfer gates 402, 403 and thereby transfer the full rail signals to an output latch responsive to latch enable signal LAT_EN that is located in the periphery of NVL array 110, for example FIG. 6 is a timing diagram illustrating writing a logic 0 to bit cell 400. The write operation begins by raising both plate lines to Vdd during time period s1. The signal transitions on PL1 and PL2 are capacitively coupled onto nodes Q and QB, effectively pulling both storage nodes almost all the way to VDD (1.5 v). Data is provided on the bit lines BL, BLB and the transfer gates 402, 403 are enabled by the pass signal PASS during time periods s2-s4 to transfer the data bit and its inverse value from the bit lines to nodes Q, QB. Sense amp 410 is enabled by sense amp enable signals SAEN, SAENB during time period s3, s4 to provide additional drive after the write data drivers have forced adequate differential on Q/QB during time period s2. However, to avoid a short from the sense amp to the 1.2 v driver supply, the write data drivers are turned off at the end of time period s2 before the sense amp is turned on during time periods s3, s4. The FeCaps coupled to the node Q or node QB having the logic zero voltage level are polarized during the third time period by maintaining the logic one voltage level on PL1 and PL2 during the third time period. The FeCaps coupled to the node Q or node QB having the logic one voltage level are polarized during the fourth time period by placing a logic zero voltage level on PL1 and PL2 during the fourth time period In an alternative embodiment, write operations may hold PL2 at 0 v or ground throughout the data write operation. This can save power during data write operations, but reduces the resulting read signal margin by 50% as C2 and C2' no longer hold data via remnant polarization and only provide a linear capacitive load to the C1 and C2 FeCaps.

Key states such as PL1 high to SAEN high during s2, SAEN high pulse during s3 during read and FeCap DC bias states s3-4 during write can selectively be made multi-cycle to provide higher robustness without slowing down the NVL clock.

Figure 7:
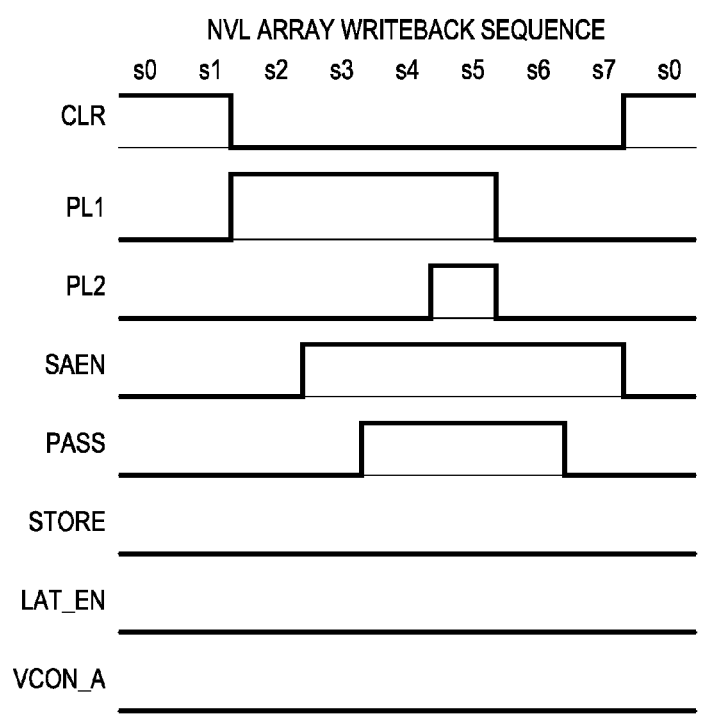

For FeCap based circuits, reading data from the FeCap's may partially depolarize the capacitors. For this reason, reading data from FeCaps is considered destructive in nature; i.e. reading the data may destroy the contents of the FeCap's or reduce the integrity of the data at a minimum. For this reason, if the data contained in the FeCap's is expected to remain valid after a read operation has occurred, the data must be written back into the FeCaps. FIG. 7 is a timing diagram illustrating a writeback operation on bitcell 400, where the bitcell is read, and then written to the same value. However, the total number of transitions is lower than what is needed for distinct and separate read and write operations (read, then write). This lowers the overall energy consumption.

Bitcell 400 is designed to maximize read differential across Q/QB in order to provide a highly reliable first generation of NVL products. Two FeCaps are used on each side rather than using one FeCap and constant BL capacitance as a load, as described in reference [7], because this doubles the differential voltage that is available to the sense amp. A sense amp is placed inside the bitcell to prevent loss of differential due to charge sharing between node Q and the BL capacitance and to avoid voltage drop across the transfer gate. The sensed voltages are around VDD/2, and a HVT transfer gate may take a long time to pass them to the BL. Bitcell 400 helps achieve twice the signal margin of a regular FRAM bitcell described in reference [6], while not allowing any DC stress across the FeCaps.

The timing of signals shown in FIGS. 5 and 6 are for illustrative purposes. Various embodiments may use signal sequences that vary depending on the clock rate, process parameters, device sizes, etc. For example, in another embodiment, the timing of the control signals may operate as follows. During time period S1: PASS goes from 0 to 1 and PL1/PL2 go from 0 to 1. During time period S2: SAEN goes from 0 to 1, during which time the sense amp may perform level shifting as will be described later, or provides additional drive strength for a non-level shifted design. During time period S3: PL1/PL2 go from 1 to 0 and the remainder of the waveforms remain the same, but are moved up one clock cycle. This sequence is one clock cycle shorter than that illustrated in FIG. 6.

In another alternative, the timing of the control signals may operate as follows. During time period S1: PASS goes from 0 to 1 (BL/BLB, Q/QB are 0 v and VDDL respectively). During time period S2: SAEN goes from 0 to 1 (BL/BLB, Q/QB are 0 v and VDDN respectively). During time period S3: PL1/PL2 go from 0 to 1 (BL/Q is coupled above ground by PL1/PL2 and is driven back low by the SA and BL drivers). During time period S4: PL1/PL2 go from 1 to 0 and the remainder of the waveforms remain the same.

Figure 8:
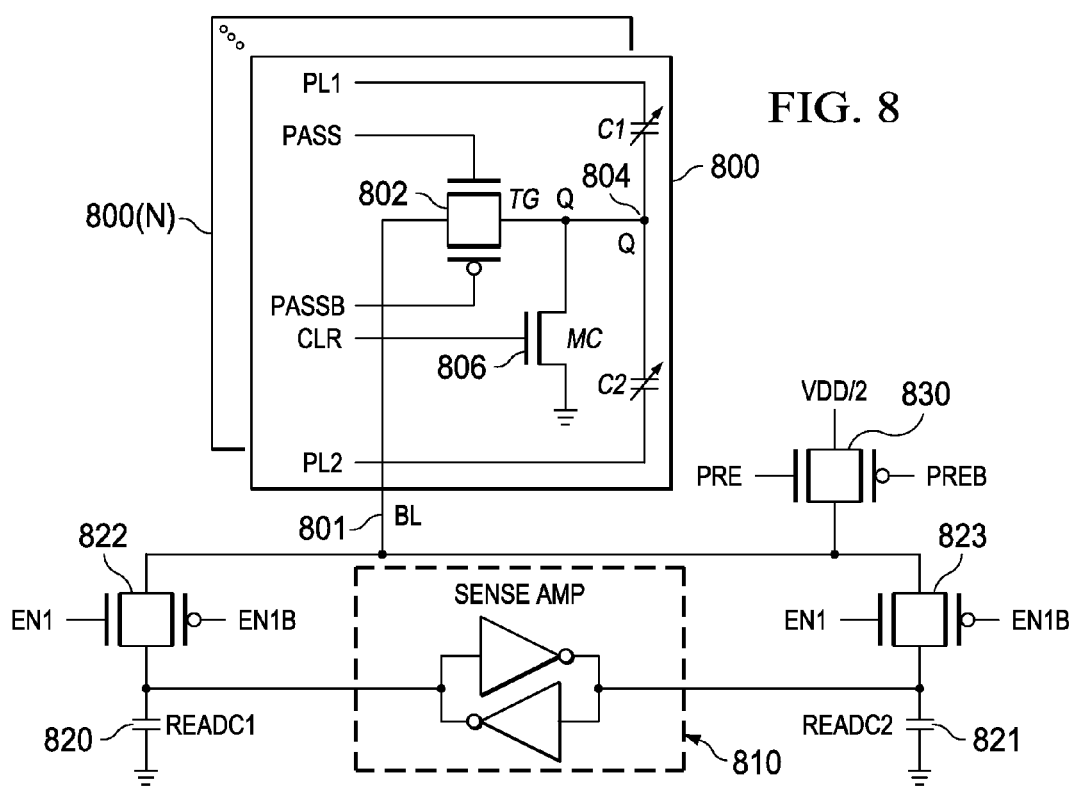

FIGS. 8-9 are a schematic and timing diagram illustrating another embodiment of a ferroelectric nonvolatile bit cell 800, a 2C-3T self-referencing based NVL bitcell. The previously described 4-FeCap based bitcell 400 uses two FeCaps on each side of a sense amp to get a differential read with double the margin as compared to a standard 1C-1T FRAM bitcell. However, a 4-FeCap based bitcell has a larger area and may have a higher variation because it uses more FeCaps.

Bitcell 800 helps achieve a differential 4-FeCap like margin in lower area by using itself as a reference, referred to herein as self-referencing. By using fewer FeCaps, it also has lower variation than a 4 FeCap bitcell. Typically, a single sided cell needs to use a reference voltage that is in the middle of the operating range of the bitcell. This in turn reduces the read margin by half as compared to a two sided cell. However, as circuit fabrication process moves, the reference value may become skewed, further reducing the read margin. A self reference scheme allows comparison of a single sided cell against itself, thereby providing a higher margin. Tests of the self referencing cell described herein have provided at least double the margin over a fixed reference cell.

Bitcell 800 has two FeCaps C1, C2 that are connected in series to form node Q 804. Plate line 1 (PL1) is coupled to FeCap C1 and plate line 2 (PL2) is coupled to FeCap C2. The plate lines are use to provide biasing to the FeCaps during reading and writing operations. Pass gate 802 is configured to couple node Q to bitline B. Pass gate 802 is implemented using a PMOS device and an NMOS device connected in parallel. This arrangement reduces voltage drop across the pass gate during a write operation so that nodes Q, QB are presented with a higher voltage during writes and thereby a higher polarization is imparted to the FeCaps. Alternatively, an NMOS pass gate may be used with a boosted word line voltage, as described earlier for bit cell 400. In this case, the PASS signal would be boosted by one NFET Vt (threshold voltage). However, this may lead to reliability problems and excess power consumption. Using a CMOS pass gate adds additional area to the bit cell but improves speed and power consumption.

Clamp transistor MC 806 is coupled to node Q. Clamp transistor 806 is configured to clamp the Q node to a voltage that is approximately equal to the low logic voltage on the plate lines in response to clear signal CLR during non-access time periods s0, which in this embodiment 0 volts (ground). In this manner, during times when the bit cell is not being accessed for reading or writing, no voltage is applied across the FeCaps and therefore TDDB and unintended partial depolarization is essentially eliminated.

The initial state of node Q, plate lines PL1 and PL2 are all 0, as shown in FIG. 9 at time period s0, so there is no DC bias across the FeCaps when the bitcell is not being accessed. To begin a read operation, PL1 is toggled high while PL2 is kept low, as shown during time period s1. A first sense voltage 902 develops on node Q from a capacitance ratio based on the retained polarization of the FeCaps from a last data value previously written into the cell, as described above with regard to equation 1. This voltage is stored on a read capacitor 820 external to the bitcell by passing the voltage though transfer gate 802 onto bit line BL in response to enable signal PASS and then through transfer gate 822 in response to a second enable signal EN1.

Then, PL1 is toggled back low and node Q is discharged using clamp transistor 806 during time period s2. Next, PL2 is toggled high keeping PL1 low during time period s3. A second sense voltage 904 develops on node Q, but this time with the opposite capacitor ratio. This voltage is then stored on another external read capacitor 821 via transfer gate 823. Thus, the same two FeCaps are used to read a high as well as low signal. Sense amplifier 810 can then determine the state of the bitcell by using the voltages stored on the external read capacitors 820, 821.

The BL and the read capacitors are precharged to voltage that is approximately half the value of the range of the voltage that appears on plate lines PL1/PL2 via precharge circuit 830 before the pass gates 802, 822, and 823 are enabled in order to minimize signal loss via charge sharing when the recovered signals on Q are transferred via BL to the read storage capacitors 820 and 821. Typically, the precharge voltage will be approximately VDDL/2, but other precharge voltage levels may be selected to optimize the operation of the bit cell.

In another embodiment, discharging node Q before producing the second sense voltage may be skipped, but this may result in reduced read margin.

Typically, there will be an array of bit cells 800. One column of bit cells 800-800n is illustrated in FIG. 8 coupled via bit line 801 to read transfer gates 822, 823. There may then be multiple columns of similar bitcells to form an n row by m column array. For example, in SoC 100, the NVL arrays are 8×32; however, as discussed earlier, different configurations may be implemented. The read capacitors and sense amps may be located in the periphery of the memory array, for example. The read capacitors may be implemented as dielectric devices, MOS devices, or any other type of voltage storage device now known or later developed.

FIG. 10 is a block diagram illustrating NVL array 110 in more detail. Embedding non-volatile elements outside the controlled environment of a large array presents reliability and fabrication challenges. As discussed earlier with reference to FIG. 1, adding testability features to individual NVL FFs may be prohibitive in terms of area overhead. To amortize the test feature costs and improve manufacturability, SoC 100 is implemented using 256 b mini-NVL arrays 110, of FeCap based bitcells dispersed throughout the logic cloud to save state of the various flip flops 120 when power is removed. Each cloud 102-104 of FFs 120 includes an associated NVL array 110. A central NVL controller 106 controls all the arrays and their communication with FFs 120.

While an NVL array may be implemented in various numbers of n rows of m column configurations, in this example, NVL array 110 is implemented with an array 1040 of eight rows and thirty-two columns of bitcells. Each individual bit cell, such as bitcell 1041, is coupled to a set of control lines provided by row drivers 1042. The control signals described earlier, including plate lines (PL1, PL2), sense amp enable (SEAN), transfer gate enable (PASS), and clear (CLR) are all driven by the row drivers. There is a set of row drivers for each row of bitcells.

Each individual bit cell, such as bitcell 1041 is also coupled via the bitlines to a set of input/output (IO) drivers 1044. In this implementation, there are thirty-two sets of IO drivers, such as IO driver set 1050. Each driver set produces an output signal 1051 that provides a data value when a row of bit lines is read. Each bitline runs the length of a column of bitcells and couples to an IO driver for that column. Each bitcell may be implemented as 2C-3T bitcell 800, for example. In this case, a single bitline will be used for each column, and the sense amps and read capacitors will be located in IO driver block 1044. In another implementation of NVL array 110, each bitcell may be implemented as 4C-12T bit cell 400. In this case, the bitlines will be a differential pair with two IO drivers for each column. A comparator may receive the differential pair of bitlines and produces a final single bit line that is provided to the output latch. Other implementations of NVL array 110 may use other known or later developed bitcells in conjunction with the row drivers and IO drivers that will be described in more detail below.

Timing logic 1046 generates timing signals that are used to control the read drivers to generate the sequence of control signals for each read and write operation. Timing logic 1046 may be implemented using synchronous or asynchronous state machines, or other known or later developed logic techniques. One potential alternative embodiment utilizes a delay chain with multiple outputs that "tap" the delay chain at desired intervals to generate control signals. Multiplexors can be used to provide multiple timing options for each control signal. Another potential embodiment uses a programmable delay generator that produces edges at the desired intervals using dedicated outputs that are connected to the appropriate control signals, for example.

Figure 11A:
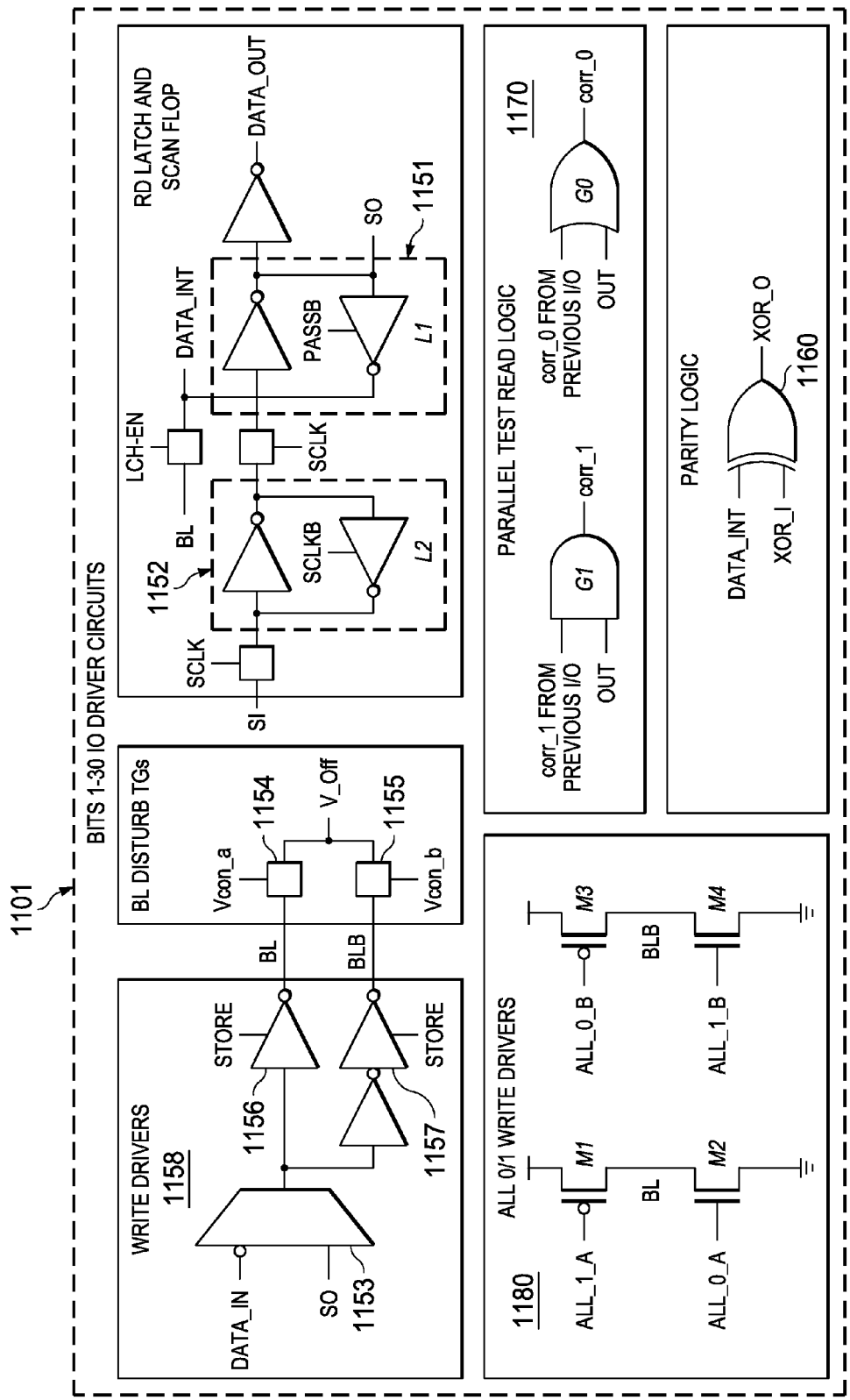
FIGS. 11A and 11B are more detailed schematics of input/output circuits used in the NVL array of FIG. 10.
Figure 11B:
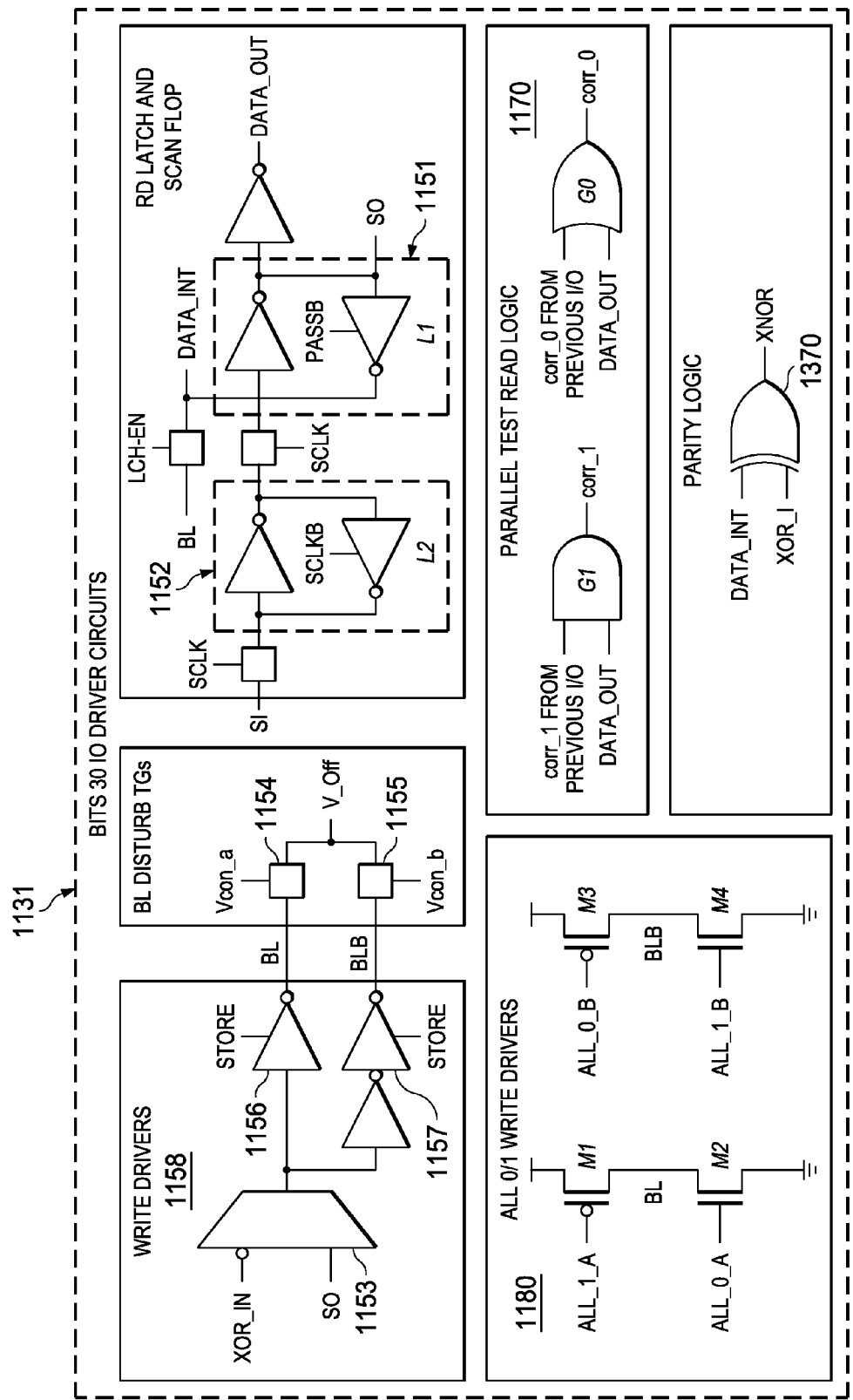

FIG. 11A is a more detailed schematic of a set of input/output circuits 1101 used in I/O block 1044 of the NVL array of FIG. 10 for IO circuits 1050 in columns 1-30, while FIG. 11B illustrates input/output circuits used for column 31. There is a similar set of IO circuits for column 0, except gates G1, G0, and 1370 are not needed. I/O block 1044 provides several features to aid testability of NVL bits.

Referring now to FIG. 11A, a first latch (L1) 1151 serves as an output latch during a read and also combines with a second latch (L2) 1152 to form a scan flip flop. The scan output (SO) signal is routed to multiplexor 1153 in the write driver block 1158 to allow writing scanned data into the array during debug. Scan output (SO) is also coupled to the scan input (SI) of the next set of IO drivers to form a thirty-two bit scan chain that can be used to read or write a complete row of bits from NVL array 110. Within SoC 100, the scan latch of each NVL array may be connected in a serial manner to form a scan chain to allow all of the NVL arrays to be accessed using the scan chain. Alternatively, the scan chain within each NVL array may be operated in a parallel fashion (N arrays will generate N chains) to reduce the number of internal scan flop bits on each chain in order to speed up scan testing. The number of chains and the number of NVL arrays per chain may be varied as needed. Typically, all of the storage latches and flipflops within SoC 100 include scan chains to allow complete testing of SoC 100. Scan testing is well known and does not need to be described in more detail herein. In this embodiment, the NVL chains are segregated from the logic chains on a chip so that the chains can be exercised independently and NVL arrays can be tested without any dependencies on logic chain organization, implementation, or control. The maximum total length of NVL scan chains will always be less than the total length of logic chains since the NVL chain length is reduced by a divisor equal to the number of rows in the NVL arrays. In the current embodiment, there are 8 entries per NVL array, so the total length of NVL scan chains is $\frac{1}{8}^{th}$ the total length of the logic scan chains. This reduces the time required to access and test NVL arrays and thus reduces test cost. Also, it eliminates the need to determine the mapping between logic flops, their position on logic scan chains and their corresponding NVL array bit location (identifying the array, row, and column location), greatly simplifying NVL test, debug, and failure analysis.

While scan testing is useful, it does not provide a good mechanism for production testing of SoC 100 since it may take a significant amount of time to scan in hundreds or thousands of bits for testing the various NVL arrays within SoC 100. This is because there is no direct access to bits within the NVL array. Each NVL bitcell is coupled to an associated flip-flop and is only written to by saving the state of the flip flop. Thus, in order to load a pattern test into an NVL array from the associated flipflops, the corresponding flip-flops must be set up using a scan chain. Determining which bits on a scan chain have to be set or cleared in order to control the contents of a particular row in an NVL array is a complex task as the connections are made based on the physical location of arbitrary groups of flops on a silicon die and not based on any regular algorithm. As such, the mapping of flops to NVL locations is not controlled and is typically somewhat random.

An improved testing technique is provided within IO drivers 1101. NVL controller 106, referring back to FIG. 1, has state machine(s) to perform fast pass/fail tests for all NVL arrays on the chip to screen out bad dies. This is done by first writing all 0's or 1's to a row using all 0/1 write driver 1180, applying an offset disturb voltage (V_Off), then reading the same row using parallel read test logic 1170. Signal corr_1 from AND gate G1 goes high if the data output signal (DATA_OUT) from data latch 1151 is high, and signal corr_1 from an adjacent column's IO driver's parallel read test logic AND gate G1 is high. In this manner, the G1 AND gates of the thirty-two sets of I/O blocks 1101/1131 in NVL array 110 implement a large 32 input AND gate that tell the NVL controller if all outputs are high for the selected row of NVL array 110. OR gate G0 does the same for reading 0's. In this manner, the NVL controller may instruct all of the NVL arrays within SoC 100 to simultaneously perform an all ones write to a selected row, and then instruct all of the NVL arrays to simultaneously read the selected row and provide a pass fail indication using only a few control signals without transferring any explicit test data from the NVL controller to the NVL arrays.

In typical memory array BIST (Built In Self Test) implementations, the BIST controller must have access to all memory output values so that each output bit can be compared with the expected value. Given there are many thousands of logic flops on typical silicon SOC chips, the total number of NVL array outputs can also measure in the thousands. It would be impractical to test these arrays using normal BIST logic circuits due to the large number of data connections and data comparators required. The NVL test method can then be repeated eight times, for NVL arrays having eight rows, so that all of the NVL arrays in SoC 100 can be tested for correct all ones operation in only eight write cycles and eight read cycles. Similarly, all of the NVL arrays in SoC 100 can be tested for correct all zeros operation in only eight write cycles and eight read cycles. The number of repetitions will vary according to the array organization. For example, a ten entry NVL array implementation would repeat the test method ten times. The results of all of the NVL arrays may be condensed into a single signal indicating pass or fail by an additional AND gate and OR gate that receive the corr_0 and corr_1 signals from each of the NVL arrays and produces a single corr_0 and corr_1 signal, or the NVL controller may look at each individual corr_0 and corr_1 signal.

All 0/1 write driver 1180 includes PMOS devices M1, M3 and NMOS devices M2, M4. Devices M1 and M2 are connected in series to form a node that is coupled to the bitline BL, while devices M3 and M4 are connected in series to form a node that is coupled to the inverse bitline BLB. Control signal "all_1_A" and inverse "all_1_B" are generated by NVL controller 106. When asserted during a write cycle, they activate device devices M1 and M4 to cause the bit lines BL and BLB to be pulled to represent a data value of logic 1. Similarly, control signal "all_0_A" and inverse "all_0_B" are generated by NVL controller 106. When asserted during a write cycle, they activate devices M2 and M3 to cause the bit lines BL and BLB to be pulled to represent a data value of logic 0. In this manner, the thirty-two drivers are operable to write all ones into a row of bit cells in response to a control signal and to write all zeros into a row of bit cells in response to another control signal. One skilled in the art can easily design other circuit topologies to accomplish the same task. The current embodiment requires only four transistors to accomplish the required data writes.

During a normal write operation, write driver block 1158 receives a data bit value to be stored on the data_in signal. Write drivers 1156, 1157 couple complimentary data signals to bitlines BL, BLB and thereby to the selected bit cell. Write drivers 1156, 1157 are enabled by the write enable signal STORE.

Figure 12A:
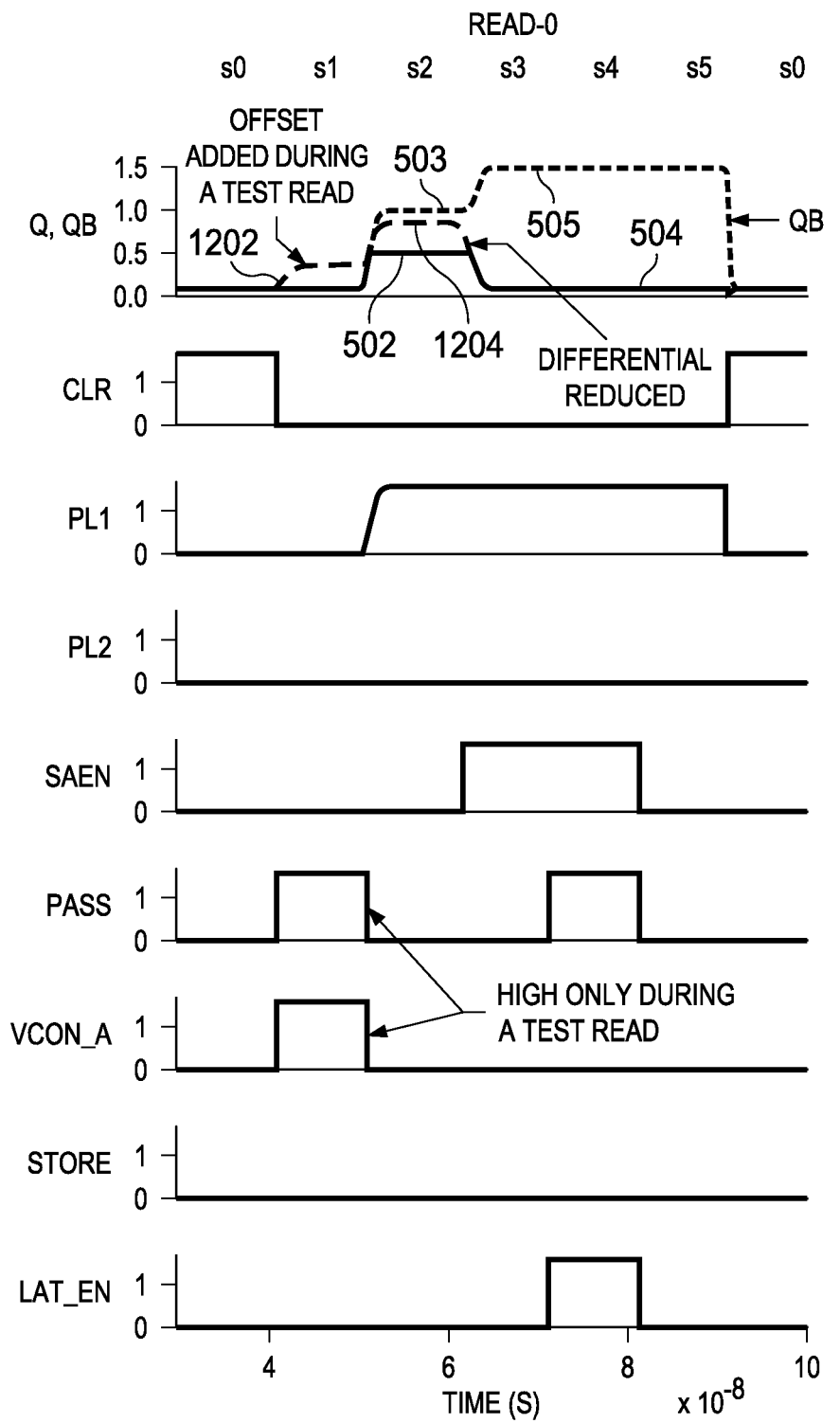
FIG. 12A is a timing diagram illustrating an offset voltage test during a read cycle.

FIG. 12A is a timing diagram illustrating an offset voltage test during a read cycle. To apply a disturb voltage to a bitcell, state s1 is modified during a read. This figure illustrates a voltage disturb test for reading a data value of "0" (node Q); a voltage disturb test for a data value of "1" is similar, but injects the disturb voltage onto the opposite side of the sense amp (node QB). Thus, the disturb voltage in this embodiment is injected onto the low voltage side of the sense amp based on the logic value being read. Bitline disturb transfer gates 1154, 1155 are coupled to the bit line BL, BLB. A digital to analog converter, not shown (may be on-chip, or off-chip in an external tester, for example), is programmed by NVL controller 106, by an off-chip test controller, or via an external production tester to produce a desired amount of offset voltage V_OFF. NVL controller 106 may assert the Vcon control signal for the bitline side storing a "0" during the s1 time period to thereby enable Vcon transfer gate 1154, 1155, discharge the other bit-line using M2/M4 during s1, and assert control signal PASS during s1 to turn on transfer gates 402, 403. This initializes the voltage on node Q/QB of the "0" storing side to offset voltage V_Off, as shown at 1202. This pre-charged voltage lowers the differential available to the SA during s3, as indicated at 1204, and thereby pushes the bitcell closer to failure. For fast production testing, V_Off may be set to a required margin value, and the pass/fail test using G0–1 may then be used to screen out any failing die.

Figure 12B:
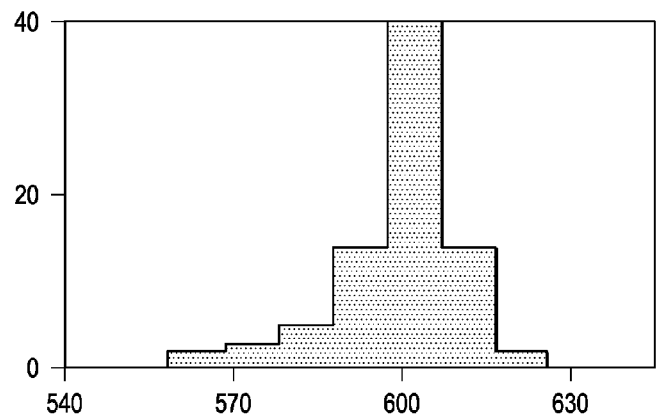
FIG. 12B illustrates a histogram generated during a sweep of offset voltage.

FIG. 12B illustrates a histogram generated during a sweep of offset voltage. Bit level failure margins can be studied by sweeping V_Off and scanning out the read data bits using a sequence of read cycles, as described above. In this example, the worst case read margin is 550 mv, the mean value is 597 mv, and the standard deviation is 22 mv. In this manner, the operating characteristics of all bit cells in each NVL array on an SoC may be easily determined.

As discussed above, embedding non-volatile elements outside the controlled environment of a large array presents reliability and fabrication challenges. The NVL bitcell should be designed for maximum read signal margin and in-situ testability as is needed for any NV-memory technology. However, NVL implementation cannot rely on SRAM like built in self test (GIST) because NVL arrays are distributed inside the logic cloud. The NVL implementation described above includes NVL arrays controlled by a central NVL controller 106. While screening a die for satisfactory behavior, NVL controller 106 runs a sequence of steps that are performed on-chip without any external tester interference. The tester only needs to issue a start signal, and apply an analog voltage which corresponds to the desired signal margin. The controller first writes all 0s or 1s to all bits in the NVL array. It then starts reading an array one row at a time. The NVL array read operations do not necessarily immediately follow NVL array write operations. For example, high temperature bake cycles may be inserted between data write operations and data read operations in order to accelerate time and temperature dependent failure mechanisms so that defects that would impact long term data retention can be screened out during manufacturing related testing. As described above in more detail, the array contains logic that ANDs and ORs all outputs of the array. These two signals are sent to the NVL controller. Upon reading each row, the NVL controller looks at the two signals from the array, and based on knowledge of what it previously wrote, decides it the data read was correct or not in the presence of the disturb voltage. If the data is incorrect, it issues a fail signal to the tester, at which point the tester can eliminate the die. If the row passes, the controller moves onto the next row in the array. All arrays can be tested in parallel at the normal NVL clock frequency. This enables high speed on-chip testing of the NVL arrays with the tester only issuing a start signal and providing the desired read signal margin voltage while the NVL controller reports pass at the end of the built in testing procedure or generates a fail signal whenever the first failing row is detected. Fails may be reported immediately so the tester can abort the test procedure at the point of first failure rather than waste additional test time testing the remaining rows. This is important as test time and thus test cost for all non-volatile memories (NVM) often dominates the overall test cost for an SOC with embedded NVM. If the NVL controller activates the "done" signal and the fail signal has not been activated at any time during the test procedure, the die undergoing testing has passed the required tests. During margin testing, the fast test mode may be disabled so that all cells can be margin tested, rather than stopping testing after an error is detected.

For further failure analysis, the controller may also have a debug mode. In this mode, the tester can specify an array and row number, and the NVL controller can then read or write to just that row. The read contents can be scanned out using the NVL scan chain. This method provides read or write access to any NVL bit on the die without CPU intervention or requiring the use of a long complicated SOC scan chains in which the mapping of NVL array bits to individual flops is random. Further, this can be done in concert with applying an analog voltage for read signal margin determination, so exact margins for individual bits can be measured.

These capabilities help make NVL practical because without testability features it would be risky to use non-volatile logic elements in a product. Further, pass/fail testing on-die with minimal tester interaction reduces test time and thereby cost.

NVL implementation using mini-arrays distributed in the logic cloud means that a sophisticated error detection method like ECC would require a significant amount of additional memory columns and control logic to be used on a per array basis, which could be prohibitive from an area standpoint. However, in order to provide an enhanced level of reliability, the NVL arrays of SoC 100 may include parity protection as a low cost error detection method, as will now be described in more detail.

Figure 13:
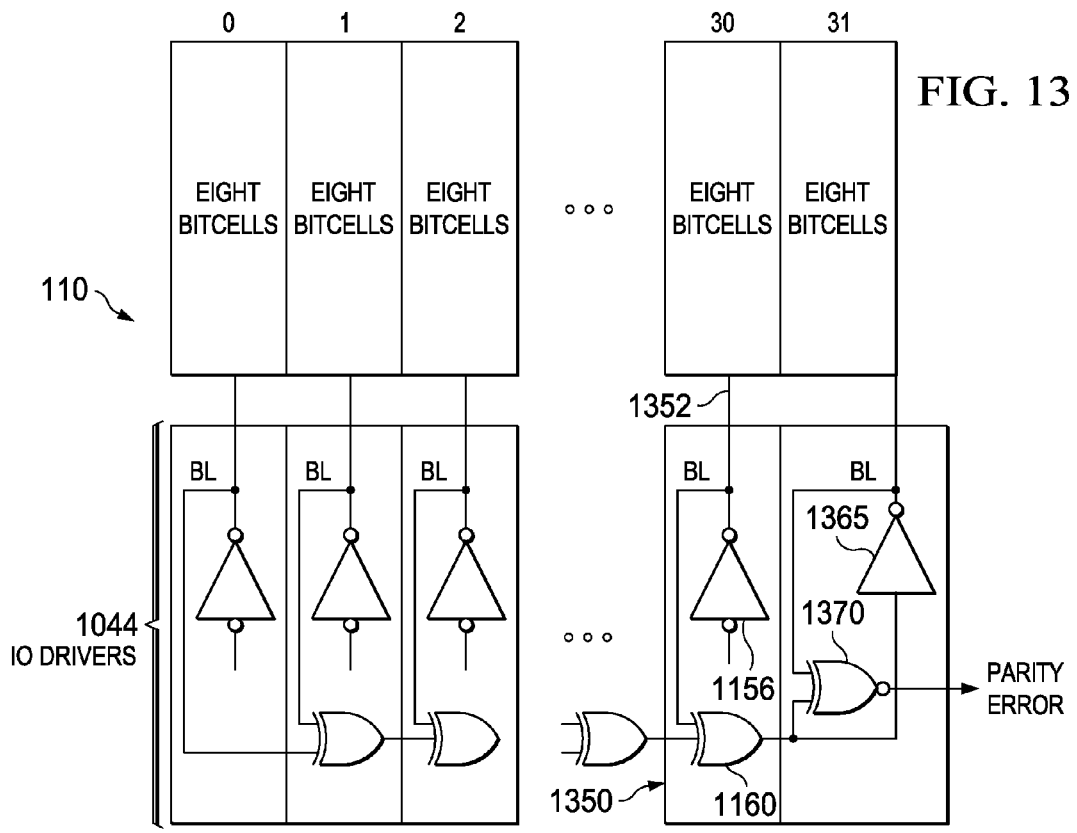
FIG. 13 is a schematic illustrating parity generation in the NVL array of FIG. 10.

FIG. 13 is a schematic illustrating parity generation in NVL array 110 that illustrates an example NVL array having thirty-two columns of bits (0:31), that exclusive-ors a data value from the bitline BL with the output of a similar XOR gate of the previous column's IO driver. Each IO driver section, such as section 1350, of the NVL array may contain an XOR gate 1160, referring again to FIG. 11A. During a write, data being written to each bitcell will appear on bitline BL and by enabling latch the output latch 1151 enable signal, the data being written is also captured in output latch 1151 and may therefore be provided to XOR gate 1160 via internal data signal DATA_INT. During a row write, the output of XOR gate 1160 that is in column 30 is the overall parity value of the row of data that is being written in bit columns 0:30 and is used to write parity values into the last column by feeding its output to the data input of mux 1153 in column 31 of the NVL mini-array, shown as XOR_IN in FIG. 11B.

In a similar manner, during a read, each XOR gate 1160 exclusive-ors the read data from bitline BL via internal data value DATA_INT from read latch 1151 (see FIG. 11A) with the output of a similar XOR gate of the previous column's IO driver. The output of XOR gate 1160 that is in bit column 30 is the overall parity value for the row of data that was read from bit columns 0:30 and is used to compare to a parity value read from bit column 31 by parity error detector XNOR gate 1370. If the overall parity value determined from the read data does not match the parity bit read from column 31, then a parity error is indicated.

When a parity error is detected, it indicates that the stored FF state values are not trustworthy. Since the NVL array is typically being read when the SoC is restarting operation after being in a power off state, then detection of a parity error indicates the saved FF state may be corrupt and that a full boot operation needs to be performed in order to regenerate the correct FF state values.

However, if the FF state was not properly stored prior to turning off the power or this is a brand new device, for example, then an indeterminate condition may exist. For example, if the NVL array is empty, then typically all of the bits may have a value of zero, or they may all have a value of one. In the case of all zeros, the parity value generated for all zeros would be zero, which would match the parity bit value of zero. Therefore, the parity test would incorrectly indicate that the FF state was correct and that a boot operation is not required, when in fact it would be required. In order to prevent this occurrence, an inverted version of the parity bit may be written to column 31 by bit line driver 1365, for example. Referring again to FIG. 11A, note that while bit line driver 1156 for columns 0-30 also inverts the input data bits, mux 1153 inverts the data_in bits when they are received, so the result is that the data in columns 0-30 is stored un-inverted. In another embodiment, the data bits may be inverted and the parity error not inverted, for example.

In the case of all ones, if there is an even number of columns, then the calculated parity would equal zero, and an inverted value of one would be stored in the parity column. Therefore, in an NVL array with an even number of data columns with all ones would not detect a parity error. In order to prevent this occurrence, NVL array 110 is constrained to have an odd number of data columns. For example, in this embodiment, there are thirty-one data columns and one parity column, for a total of thirty-two bitcell columns.

In some embodiments, when an NVL read operation occurs, control logic for the NVL array causes the parity bit to be read, inverted, and written back. This allows the NVL array to detect when prior NVL array writes were incomplete or invalid/damaged. Remnant polarization is not completely wiped out by a single read cycle. Typically, it take 5-15 read cycles to fully depolarize the FeCaps or to corrupt the data enough to reliably trigger an NVL read parity. For example, if only four out of eight NVL array rows were written during the last NVL store operation due to loss of power, this would most likely result in an incomplete capture of the prior machine state. However, because of remnant polarization, the four rows that were not written in the most recent state storage sequence will likely still contain stale data from back in time, such as two NVL store events ago, rather than data from the most recent NVL data store event. The parity and stale data from the four rows will likely be read as valid data rather than invalid data. This is highly likely to cause the machine to lock up or crash when the machine state is restored from the NVL arrays during the next wakeup/power up event. Therefore, by writing back the parity bit inverted after every entry is read, each row of stale data is essentially forcibly invalidated.

Writing data back to NVL entries is power intensive, so it is preferable to not write data back to all bits, just the parity bit. The current embodiment of the array disables the PL1, PL2, and sense amp enable signals for all non-parity bits (i.e. Data bits) to minimize the parasitic power consumption of this feature. In another embodiment, a different bit than the parity bit may be forcibly inverted, for example, to produce the same result.

In this manner, each time the SoC transitions from a no-power state to a power-on state, a valid determination can be made that the data being read from the NVL arrays contains valid FF state information. If a parity error is detected, then a boot operation can be performed in place of restoring incorrect FF state from the NVL arrays.

Referring back to FIG. 1, low power SoC 100 has multiple voltage and power domains, such as VDDN_FV, VDDN_CV for the NVL arrays, VDDR for the sleep mode retention latches and well supplies, and VDDL for the bulk of the logic blocks that form the system microcontroller, various peripheral devices, SRAM, ROM, etc., as described earlier with regard to Table 1 and Table 2. FRAM has internal power switches and is connected to the always on supply VDDZ In addition, the VDDN_FV domain may be designed to operate at one voltage, such as 1.5 volts needed by the FeCap bit cells, while the VDDL and VDDN_CV domain may be designed to operate at a lower voltage to conserve power, such as 0.9-1.5 volts, for example. Such an implementation requires using power switches 108, level conversion, and isolation in appropriate areas. Aspects of isolation and level conversion needed with respect to NVL blocks 110 will now be described in more detail. The circuits are designed such that VDDL/VDDN_CV can be any valid voltage less than or equal to VDDN_FV and the circuit will function correctly.

Figure 14:
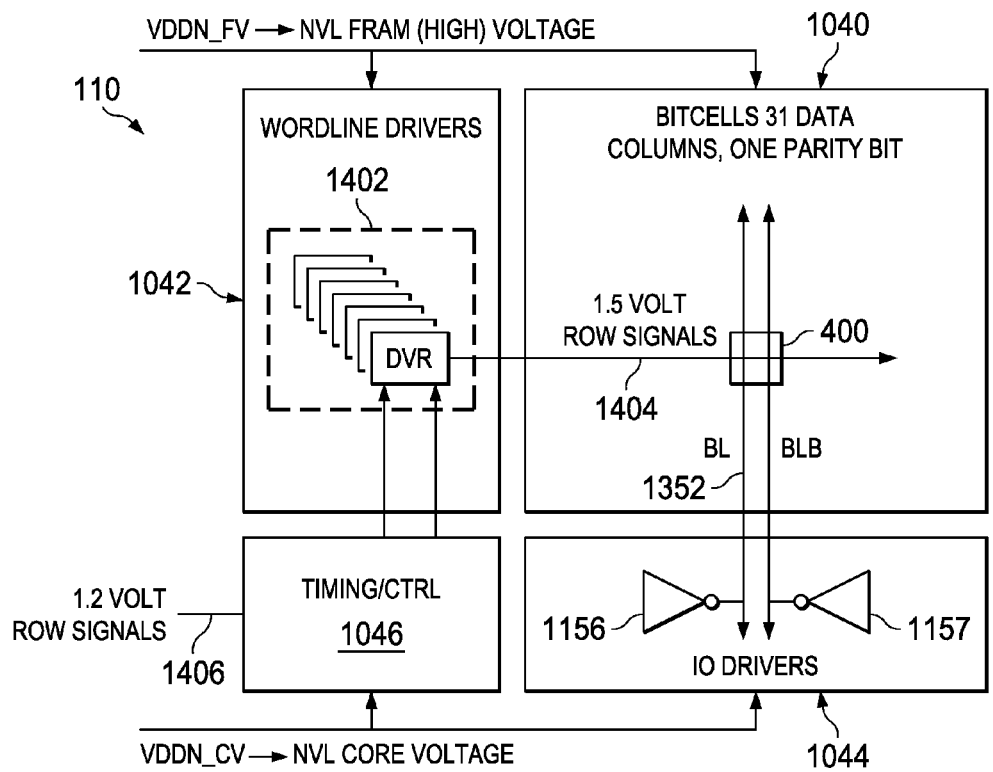
FIG. 14 is a block diagram illustrating power domains within an NVL array.

FIG. 14 is a block diagram illustrating power domains within NVL array 110. Various blocks of logic and memory may be arranged as illustrated in Table 3.

TABLE 3

| Full Chip Voltage Domain | Voltage level | example full chip power domains |
|---|---|---|
| VDD | 0.9-1.5 | Always ON supply for VDDL, VDDR, VDDN_CV power switches, and always ON logic (if any) |
| VDDZ | 1.5 | Always on 1.5 V supply for FRAM, and for VDDN_FV power switches. FRAM has internal power switches. |

TABLE 3-continued example full chip power domains

| Full Chip Voltage Domain | Voltage level | |
|---|---|---|
| VDDL | 0.9-1.5 | All logic, and master stage of all flops, SRAM, ROM, Write multiplexor, buffers on FF outputs, and mux outputs: Variable logic voltage; e.g. 0.9 to 1.5 V (VDDL). This supply is derived from the output of VDDL power switches |
| VDDN_CV | 0.9-1.5 | NVL array control and timing logic, and IO circuits, NVL controller. Derived from VDDN_CV power switches. |
| VDDN_FV | 1.5 | NVL array Wordline driver circuits 1042 and NVL bitcell array 1040: Same voltage as FRAM. Derived from VDDN_FV power switches. |
| VDDR | 0.9-1.5 | This is the data retention domain and includes the slave stage of retention flops, buffers on NVL clock, flop retention enable signal buffers, and NVL control outputs such as flop update control signal buffers, and buffers on NVL data outputs. Derived from VDDR power switches. |

Power domains VDDL, VDDN_CV, VDDN_FV, and VDDR described in Table 3 are controlled using a separate set of power switches, such as switches 108 described earlier. However, isolation may be needed for some conditions. Data output buffers within IO buffer block 1044 are in the NVL logic power domain VDDN_CV and therefore may remain off while domain VDDR (or VDDL depending on the specific implementation) is ON during normal operation of the chip. ISO-Low isolation is implemented to tie all such signals to ground during such a situation. While VDDN_CV is off, logic connected to data outputs in VDDR (or VDDL depending on the specific implementation) domain in random logic area may generate short circuit current between power and ground in internal circuits if any signals from the VDDN_CV domain are floating (not driven when VDDN_CV domain is powered down) if they are not isolated. The same is applicable for correct_0/1 outputs and scan out output of the NVL arrays. The general idea here is that any outputs of the NVL array be isolated when the NVL array has no power given to it. In case there is always ON logic present in the chip, all signals going from VDDL or VDDN_CV to VDD must be isolated using input isolation at the VDD domain periphery. Additional built-in isolation exists in NVL flops at the ND input. Here, the input goes to a transmission gate, whose control signal NU is driven by an always on signal. When the input is expected to be indeterminate, NU is made low, thereby disabling the ND input port. Similar built-in isolation exists on data inputs and scan-in of the NVL array. This isolation would be needed during NVL restore when VDDL is OFF. Additionally, signals NU and NVL data input multiplexor enable signals (mux_sel) may be buffered only in the VDDR domain. The same applies for the retention enable signal.

To enable the various power saving modes of operation, VDDL, VDDN_CV, and VDDN_FV domains are shut off at various times, and isolation is critical in making that possible without allowing short circuit current or other leakage current.

Level conversion from the lower voltage VDDL domain to the higher voltage VDDN domain is needed on control inputs of the NVL arrays that go to the NVL bitcells, such as: row enables, PL1, PL2, restore, recall, and clear, for example. This enables a reduction is system power dissipation by allowing blocks of SOC logic and NVL logic gates that can operate at a lower voltage to do so. For each row of bitcells in bitcell array 1040, there is a set of word line drivers 1042 that drive the signals for each row of bitcells, including plate lines PL1, PL2, transfer gate enable PASS, sense amp enable SAEN, clear enable CLR, and voltage margin test enable VCON, for example. The bitcell array 1040 and the wordline circuit block 1042 are supplied by VDDN. Level shifting on input signals to 1042 are handled by dedicated level shifters (see FIG. 15), while level shifting on inputs to the bitcell array 1040 may be handled by special sequencing of the circuits within the NVL bitcells without adding any additional dedicated circuits to the array data path or bitcells.

Figure 15:
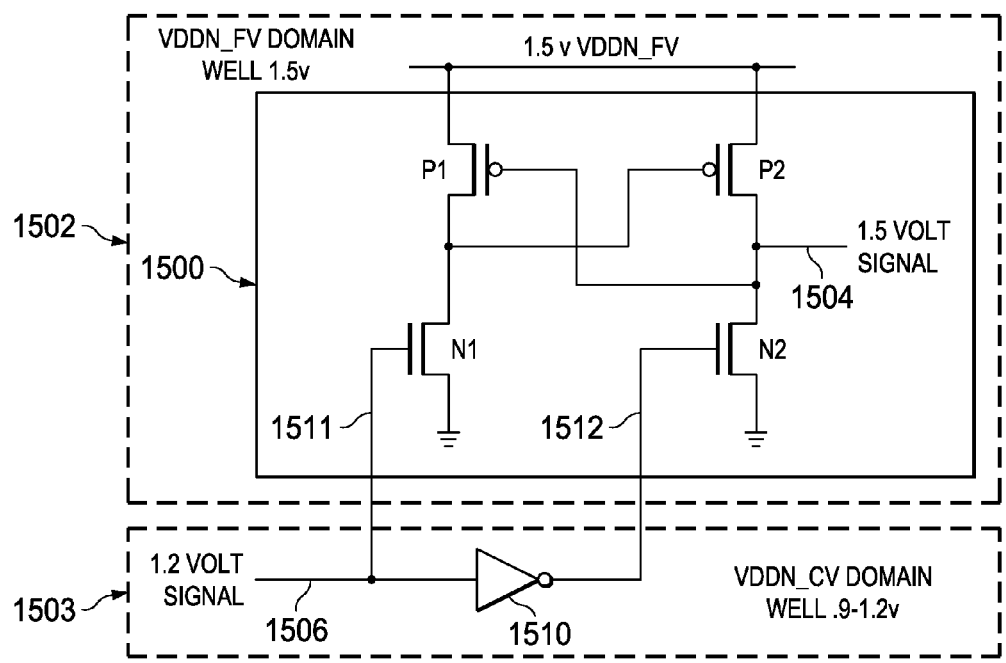
FIG. 15 is a schematic of a level converter for use in the NVL array.

FIG. 15 is a schematic of a level converter 1500 for use in NVL array 110. FIG. 15 illustrates one wordline driver that may be part of the set of wordline drivers 1402. Level converter 1500 includes PMOS transistors P1, P2 and NMOS transistor N1, N2 that are formed in region 1502 in the 1.5 volt VDDN domain for wordline drivers 1042. However, the control logic in timing and control module 1046 is located in region 1503 in the 1.2 v VDDL domain (1.2 v is used to represent the variable VDDL core supply that can range from 0.9 v to 1.5 v). 1.2 volt signal 1506 is representative of any of the row control signals that are generated by control module 1046, for use in accessing NVL bitcell array 1040. Inverter 1510 forms a complimentary pair of control signals 1511, 1512 in region 1503 that are then routed to transistors N1 and N2 in level converter 1500. In operation, when 1.2 volt signal 1506 goes high, NMOS device N1 pulls the gate of PMOS device P2 low, which causes P2 to pull signal 1504 up to 1.5 volts. Similarly, when 1.2 volt signal 1506 goes low, complimentary signal 1512 causes NMOS device N2 to pull the gate of PMOS device P1 low, which pulls up the gate of PMOS device P2 and allows signal 1504 to go low, approximately zero volts. The NMOS devices must be stronger than the PMOS so the converter doesn't get stuck. In this manner, level shifting may be done across the voltage domains and power may be saved by placing the control logic, including inverter 1510, in the lower voltage domain 1503. For each signal, the controller is coupled to each of level converter 1500 by two complimentary control signals 1511, 1512. In this manner, data path timing in driver circuit 1500 may be easily balanced without the need for inversion of a control signal.

Figure 16:
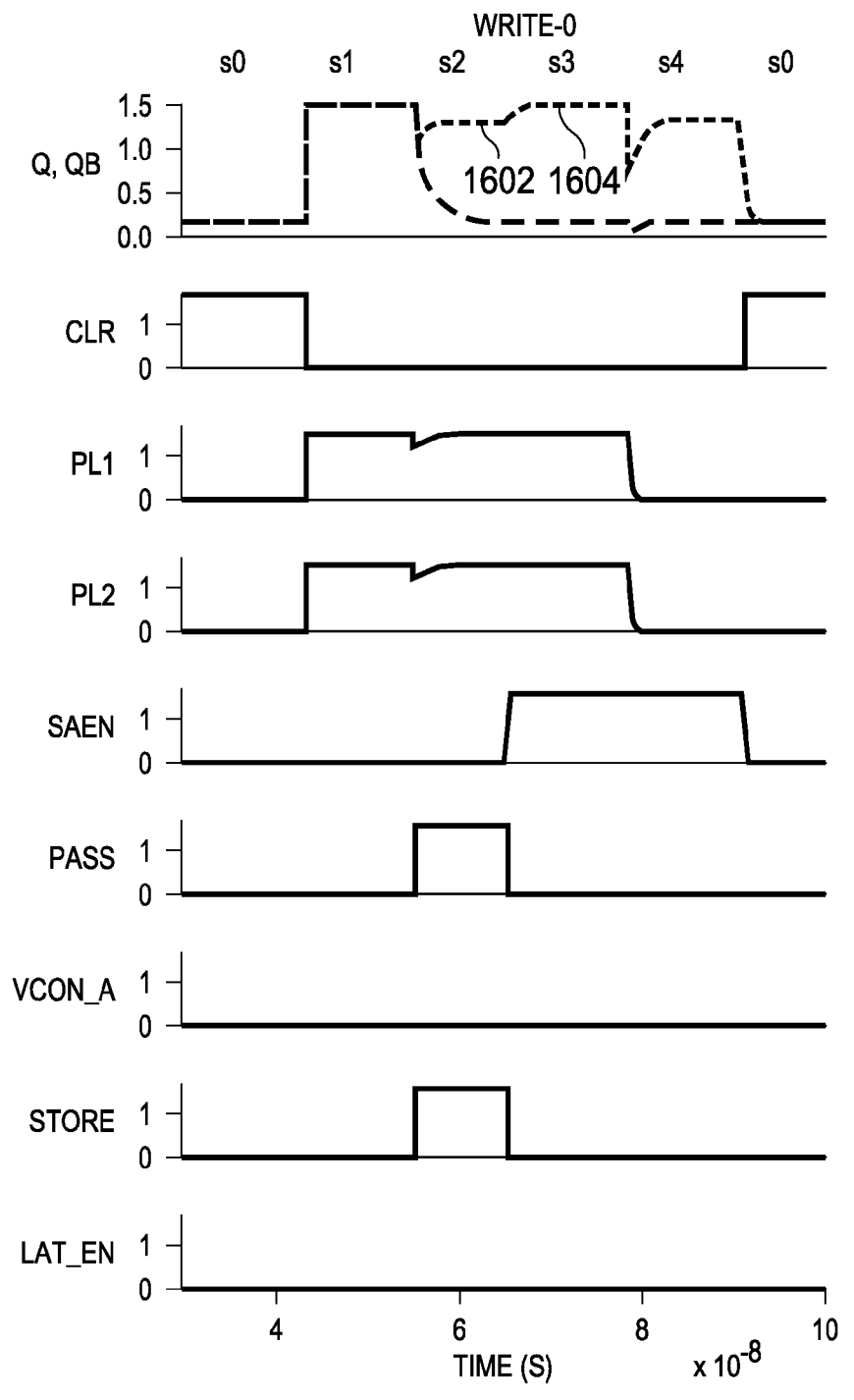
FIG. 16 is a timing diagram illustrating operation of level shifting using a sense amp within a ferroelectric bitcell.

FIG. 16 is a timing diagram illustrating operation of level shifting using a sense amp within a ferroelectric bitcell. Input data that is provided to NVL array 110 from multiplexor 212, referring again to FIG. 2, also needs to be level shifted from the 1.2 v VDDL domain to 1.5 volts needed for best operation of the FeCaps in the 1.5 volt VDDN domain during write operations. This may be done using the sense amp of bit cell 400, for example. Referring again to FIG. 4 and to FIG. 13, note that each bit line BL, such as BL 1352, which comes from the 1.2 volt VDDL domain, is coupled to transfer gate 402 or 403 within bitcell 400. Sense amp 410 operates in the 1.5 v VDDN power domain. Referring now to FIG. 16, note that during time period s2, data is provided on the bit lines BL, BLB and the transfer gates 402, 403 are enabled by the pass signal PASS during time periods s2 to transfer the data bit and its inverse value from the bit lines to differential nodes Q, QB. However, as shown at 1602, the voltage level transferred is limited to less than the 1.5 volt level because the bit line drivers are located in the 1.2 v VDDL domain.

Sense amp 410 is enabled by sense amp enable signals SAEN, SAENB during time period s3, s4 to provide additional drive, as illustrated at 1604, after the write data drivers, such as write driver 1156, 1157, have forced adequate differential 1602 on Q/QB during time period s2. Since the sense amp is supplied by a higher voltage (VDDN), the sense amp will respond to the differential established across the sense amp by the write data drivers and will clamp the logic 0 side (Q or QB) of the sense amp to VSS (substrate voltage, ground) while the other side containing the logic 1 is pulled up to VDDN voltage level. In this manner, the existing NVL array hardware is reused to provide a voltage level shifting function during NVL store operations.

However, to avoid a short from the sense amp to the 1.2 v driver supply, the write data drivers are isolated from the sense amp at the end of time period s2 before the sense amp is turned on during time periods s3, s4. This may be done by turning off the bit line drivers by de-asserting the STORE signal after time period s2 and/or also by disabling the transfer gates by de-asserting PASS after time period s2.

Figure 17:
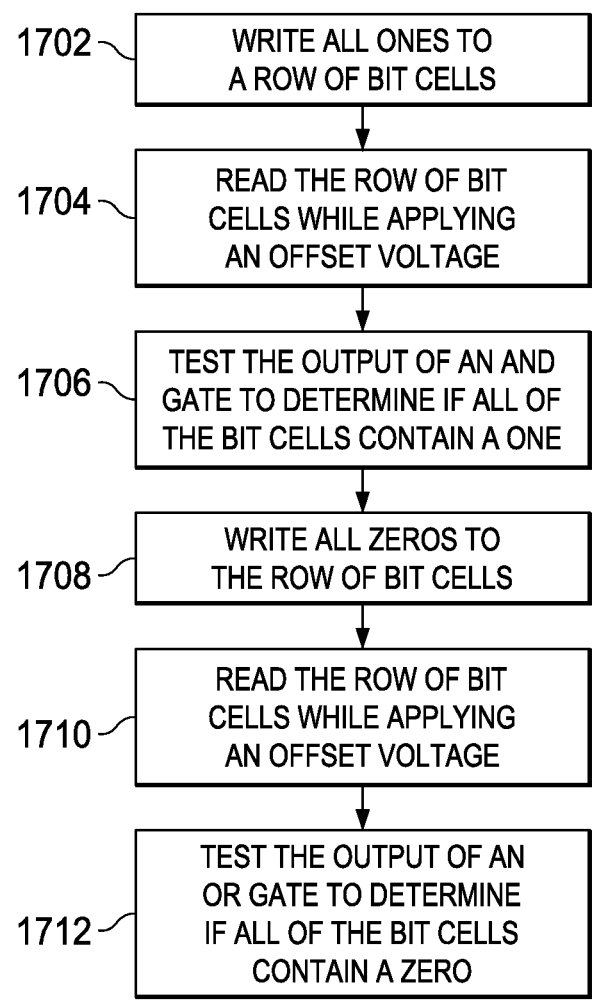
FIG. 17 is a flow chart illustrating operation of a nonvolatile logic array with a built-in test result signal.

FIG. 17 is a flow chart illustrating operation of a nonvolatile logic array with a built-in test result signal. A method for testing a memory array having n rows by m columns of bit cells within a system on a chip (SoC), may begin by writing 1702 all ones to a row of bit cells. Writing all ones may be done using the all ones drivers under control of the on-chip NVL controller, as described earlier, or may be done by scanning in a set of ones using the scan chain, as described earlier, for example.

After the row is written, then the row of bit cells is read 1704. A distributed OR gate and a distributed AND each produce a pass/fail signal by ANDing and ORing the results obtained by reading the row of bitcells. If all of the bitcells provided a logic value of one, then the AND gate will assert a pass signal, otherwise, the signal will indicate a failure.

The pass/fail signal output of the AND gate is tested 1706 to determine if all of the bit cells in the row contain a one.

All zeros are then written 1708 to the row of bitcells. Writing all zeros may be done using the all zeros drivers under control of the on-chip NVL controller, as described earlier, or may be done by scanning in a set of zeros using the scan chain, as described earlier, for example.

After the row is written, then the row of bit cells is read 1710. The distributed OR gate and a distributed AND each produce a pass/fail signal by ANDing and ORing the results obtained by reading the row of bitcells. If all of the bitcells provided a logic value of zero, then the OR gate will assert a pass signal, otherwise, the signal will indicate a failure.

Of course, the order of testing for ones and zeros may be reversed. All of the rows in an array may be written before doing the read test, or the test may be performed row by row, for example.

While performing each read 1704 and 1710, an offset voltage may be applied, as described in more detail above, to provide margin testing of each row of cells. Bit level failure margins can be studied by sweeping the offset voltage across a range of values and scanning out the read data bits using a sequence of read cycles, as described above.

System Example

Figure 18:
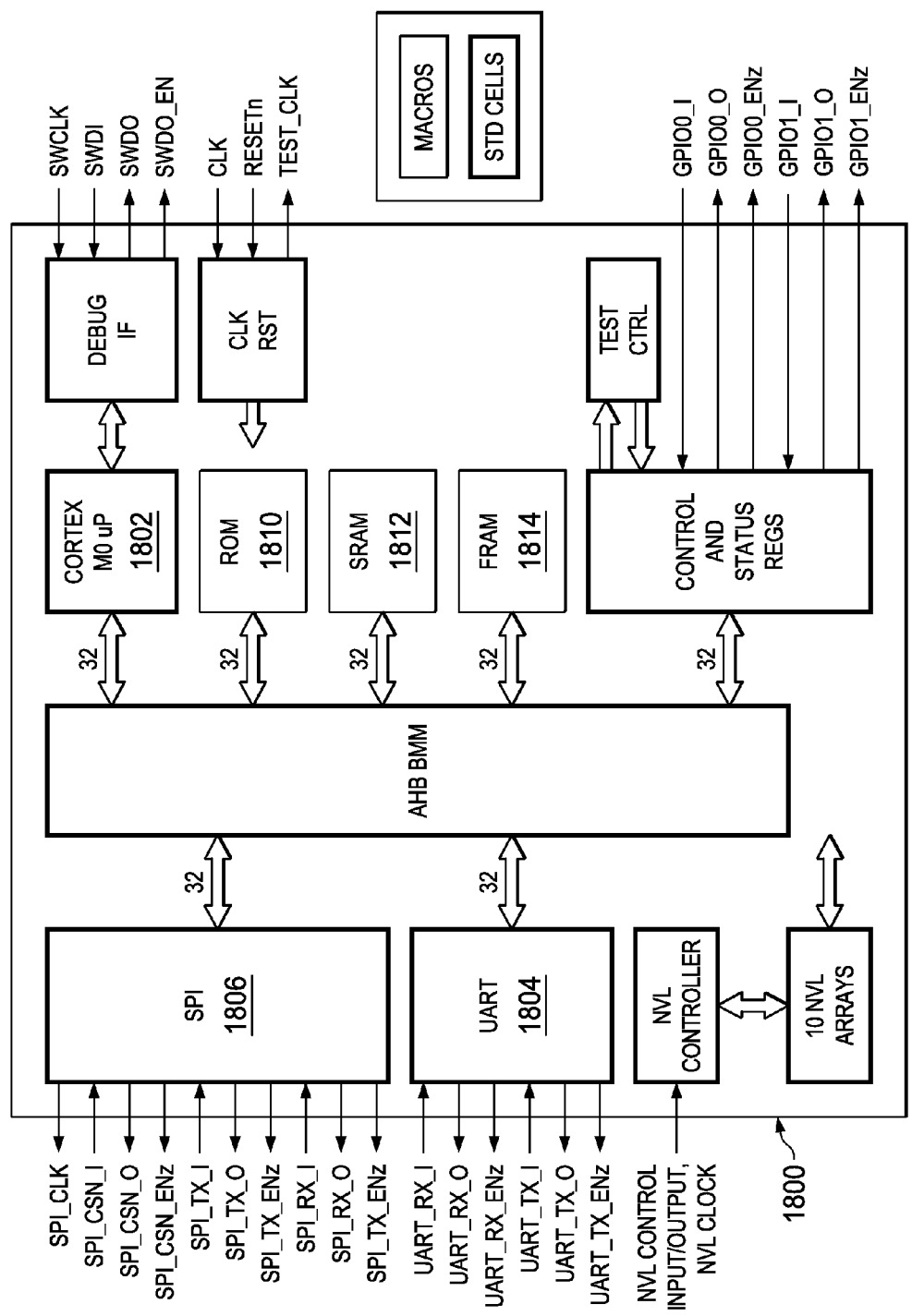
FIG. 18 is a block diagram of another SoC that includes NVL arrays.

FIG. 18 is a block diagram of another SoC 1800 that includes NVL arrays, as described above. SoC 1800 features a Cortex-M0 processor core 1802, UART 1804 and SPI (serial peripheral interface) 1806 interfaces, and 10 KB ROM 1810, 8 KB SRAM 1812, 64 KB (Ferroelectric RAM) FRAM 1814 memory blocks, characteristic of a commercial ultra low power (ULP) microcontroller. The 130 nm FRAM process, see reference [1], based SoC uses a single 1.5V supply, an 8 MHz system clock and a 125 MHz clock for NVL operation. The SoC consumes 75 uA/MHz & 170 uA/MHz while running code from SRAM & FRAM respectively. The energy and time cost of backing up and restoring the entire system state of 2537 FFs requires only 4.72 nJ & 320 ns and 1.34 nJ & 384 ns respectively, which sets the industry benchmark for this class of device. SoC 1800 provides test capability for each NVL bit, as described in more detail above, and in-situ read signal margin of 550 mV.

SoC 1800 has 2537 FFs and latches served by 10 NVL arrays. A central NVL controller controls all the arrays and their communication with FFs, as described in more detail above. The distributed NVL mini-array system architecture helps amortize test feature costs, achieving a SoC area overhead of only 3.6% with exceptionally low system level sleep/wakeup energy cost of 2.2 pJ/0.66 pJ per bit.

Other Embodiments

Although the invention finds particular application to microcontrollers (MCU) implemented, for example, in a System on a Chip (SoC), it also finds application to other forms of processors and integrated circuits. A SoC may contain one or more modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, other portable, or mobile systems such as remote controls, access badges and fobs, smart credit/debit cards and emulators, smart phones, digital assistants, and any other now known or later developed portable or embedded system may embody NVL arrays as described herein to allow nearly immediate recovery to a full operating state from a completely powered down state.

While embodiments of retention latches coupled to a nonvolatile FeCap bitcell are described herein, in another embodiment, a nonvolatile FeCap bitcell from an NVL array may be coupled to flip-flop or latch that does not include a low power retention latch. In this case, the system would transition between a full power state, or otherwise reduced power state based on reduced voltage or clock rate, and a totally off power state, for example. As described above, before turning off the power, the state of the flipflops and latches would be saved in distributed NVL arrays. When power is restored, the flipflops would be initialized via an input provided by the associated NVL array bitcell.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

REFERENCES

[1] T. S. Moise, et al., "Electrical Properties of Submicron (>0.13 um2) Ir/PZT/Ir Capacitors Formed on W Plugs," *Int. Elec. Dev. Meet*, 1999

[2] S. Masui, et al., "Design and Applications of Ferroelectric Nonvolatile SRAM and Flip-FF with Unlimited Read, Program Cycles and Stable Recall," *IEEE CICC*, September 2003

[3] W. Yu, et al., "A Non-Volatile Microcontroller with Integrated Floating-Gate Transistors," IEEE DSN-W, June 2011

[4] Y. Wang, et al., "A Compression-based Area-efficient Recovery Architecture for Nonvolatile Processors," *IEEE DATE*, March 2012

[5] Y. Wang, et al., "A 3 us Wake-up Time Nonvolatile Processor Based on Ferroelectric Flip-Flops," IEEE ESS-CIRC, September 2012

[6] K. R. Udayakumar, et al., "Manufacturable High-Density 8 Mbit One Transistor—One Capacitor Embedded Ferroelectric Random Access Memory," JPN. J. Appl. Phys., 2008

[7] T. S. Moise, et al., "Demonstration of a 4 Mb, High-Density Ferroelectric Memory Embedded within a 130 nm Cu/FSG Logic Process," *IEDM*, 2002

What is claimed is:

1. A system on chip (SoC) comprising a memory array, wherein the memory array comprises:
   n rows by m columns of bit cells, wherein each of the bit cells is configured to store a bit of data; m bit lines each coupled to a corresponding one of the m columns of bit cells; m write drivers each coupled to a corresponding one of the m bit lines;
   an AND gate having n inputs each coupled to a corresponding one of the m bit lines,
   the AND gate having an output line; and an OR gate having n inputs each coupled to a corresponding one of the m bit lines, the OR gate having an output line, further comprising a test controller coupled to receive the output line from the AND gate and the output line form the OR gate, wherein the test controller on the SoC is operable to test the memory array by writing all ones to a row of bit cells and then reading the row of bit cells and testing the output of the AND gate to determine if all of the bit cells in the row contain a one; and by writing all zeros to the row of bit cells and then reading the row of bit cells and testing the output of the OR gate to determine if all of the bit cells in the row contain a zero.

2. The SoC of claim 1, wherein the m bit lines are differential pairs of bit lines.

3. The SoC of claim 1, wherein the AND gate comprises a set of two input AND gates connected in a daisy chain manner and distributed across the m columns, and wherein the OR gate comprises a set of two input OR gates connected in a daisy chain manner and distributed across the m columns.

4. The SoC of claim 1, wherein the SoC further comprises a set of volatile flip-flops, wherein the bit cells are non-volatile bit cells, and wherein each of the volatile flip flops is interchangeably coupled to a corresponding one of the non-volatile bit cells.

5. The SoC array of claim 4, wherein the SoC further comprises a plurality of the memory arrays and a plurality of the sets of volatile flip flops, wherein the output of the AND gate and the output of the OR gate in each of the plurality of memory arrays is coupled to the test controller.

6. The SoC array of claim 1, wherein each of the m drivers comprise a write one circuit and a write zero circuit, wherein the m drivers are operable to write all ones into a row of bit cells in response to a control signal and to write all zeros into a row of bit cells in response to another control signal.

7. The SoC of claim 1, wherein each of the m drivers comprise a transfer gate configured to transfer an offset voltage into a sense node of the bitcell during a read access in response to a control signal.

8. The SoC of claim 1, wherein the test controller is operable to provide a fail signal to an external tester in response to the output line from the AND gate and to the output line from the OR gate.

9. A method for testing a memory array having n rows by m columns of bit cells within a system on a chip (SoC), the method comprising:
   writing all ones to a row of bit cells;
   reading the row of bit cells;
   testing the output of an AND gate having n inputs each coupled to a corresponding one of the m columns of bit cells to determine if all of the bit cells in the row contain a one;
   writing all zeros to the row of bit cells
   reading the row of bit cells; and testing the output of an OR gate having n inputs each coupled to a corresponding one of the m columns of bits cells to determine if all of the bit cells in the row contain a zero.

10. The method of claim 9, wherein writing all ones to a row of bit cells is performed by asserting a first control signal to a write ones circuit included within a set of bit line drivers of the memory array; and wherein writing all zeros to the row of bit cells is performed by asserting a second control signal to a write zeros circuit included within the set of bit line drivers of the memory array.

11. The method of claim 9, further comprising:

removing power from the memory array after writing all ones or all zeros to a row of bit cells;

baking the memory array at an elevated temperature for a period of time;

restoring power to the memory array and then reading the row of bit cells and testing the output of the AND gate to determine if all of the bit cells in the row contain a one or testing the output of the OR gate to determine if all of the bit cells in the row contain a zero.

12. The method of claim 9, further comprising applying an offset voltage to each bitcell in the row via a pass gate included within a set of bit line drivers of the memory array while reading the row of bit cells.

13. The method of claim 12, further comprising repeatedly increasing the offset voltage and repeating reading a row of bit cells and testing the output of the AND gate or OR gate until a failure is detected, whereby a failure margin of the memory array is determined.

14. The method of claim 10, wherein a plurality of memory arrays within the SoC are tested simultaneously under control of test controller within the SoC by:

simultaneously asserting the first control signal to a write ones circuit included in each of the plurality of memory arrays to write all ones to a row of bit cells;

simultaneously reading the row of bit cells in each of the plurality of memory arrays;

simultaneously testing the output of an AND gate from each of the plurality of memory arrays to determine if all of the bit cells in the row of each of the plurality of memory arrays contain a one;

simultaneously asserting the second control signal to a write zeros circuit included in each of the plurality of memory arrays to write all zeros to the row of bit cells;

simultaneously reading the row of bit cells in each of the plurality of memory arrays; and simultaneously testing the output of an OR gate from each of the plurality of memory arrays to determine if all of the bit cells in the row of each of the plurality of memory arrays contain a zero.

* * * * *